(12) United States Patent
Mizuno

(10) Patent No.: US 8,284,564 B2
(45) Date of Patent: Oct. 9, 2012

(54) CIRCUIT BOARD

(75) Inventor: Satoshi Mizuno, Tokyo (JP)

(73) Assignee: Sony Corporation, Tokyo (JP)

( * ) Notice: Subject to any disclaimer, the term of this patent is extended or adjusted under 35 U.S.C. 154(b) by 445 days.

(21) Appl. No.: 12/697,737

(22) Filed: Feb. 1, 2010

(65) Prior Publication Data

US 2010/0202123 A1   Aug. 12, 2010

(30) Foreign Application Priority Data

Feb. 9, 2009   (JP) .................................. 2009-027936

(51) Int. Cl.
  *H01R 9/00*   (2006.01)
(52) U.S. Cl. ......................... 361/776; 361/777; 361/792
(58) Field of Classification Search .................. 361/776, 361/777
  See application file for complete search history.

(56) References Cited

U.S. PATENT DOCUMENTS

| | | | | |
|---|---|---|---|---|
| 5,682,297 | A  * | 10/1997 | Silva ............................. | 361/777 |
| 2007/0158101 | A1 * | 7/2007 | Chikagawa et al. .......... | 174/260 |
| 2009/0237902 | A1 * | 9/2009 | Kouya .......................... | 361/777 |
| 2010/0039784 | A1 * | 2/2010 | Hayashi ....................... | 361/777 |

FOREIGN PATENT DOCUMENTS

| | | |
|---|---|---|
| JP | 09-326451 | 12/1997 |
| JP | 10-223997 | 8/1998 |
| JP | 2001-053449 | 2/2001 |
| JP | 2002-299840 | 10/2002 |
| JP | 2003-218541 | 7/2003 |

\* cited by examiner

*Primary Examiner* — Tuan T Dinh
*Assistant Examiner* — Steven Sawyer
(74) *Attorney, Agent, or Firm* — Wolf, Greenfield & Sacks, P.C.

(57) ABSTRACT

A circuit board includes balls as electrodes in a grid, a power supply wiring pattern area connected to power supply terminals of an integrated circuit mounted thereon, and a feeding pattern area connected to a feeding point; the balls include first and second power supply ball groups connected respectively to power supply terminal arrays, at a predetermined interval, of the integrated circuit, and the power supply wiring pattern area includes first and second power supply connection patterns connected respectively to the first and second ball groups, and at least one connection pattern connecting the first and second power supply connection patterns non-contact to the balls, and has first and second connection portions connected respectively to the feeding pattern area and one electrode of a first bypass capacitor, and the second power supply connection pattern has a third connection portion connected to one electrode of a second bypass capacitor.

10 Claims, 33 Drawing Sheets

FIG. 33

| LSI, PCB, MEASUREMENT CONDITION | SETUP JITTER | HOLD JITTER | TOTAL JITTER | EYE WIDTH | SLEW RATE | POWER SUPPLY NOISE | CK JITTER | NOTE |
|---|---|---|---|---|---|---|---|---|
| (1) PTN1 PRESENT DECAP | 233 ps | −69 ps | 164 ps | 3624 ps | 0.9 v/ns | 209 mvpp | 160 ps | |
| (2) PTN2 DECAP WITHOUT C268 | 414 ps | −88 ps | 326 ps | 3462 ps | 0.9 v/ns | 356 mvpp | 260 ps | · C268 tDS JITTER EFFECT: 181 ps |
| (3) PTN3 DECAP WITHOUT C268, RIGHT PATTERNS ONLY | 448 ps | −88 ps | 360 ps | 3428 ps | 0.9 v/ns | 381 mvpp | 270 ps | · LEFT PATTERNS + C268 + CENTRAL BALL tDS JITTER EFFECT: 215 ps |
| (4) PTN4 PRESENT DECAP, WITHOUT GRID PATTERNS FROM PTN1 | 231 ps | −61 ps | 170 ps | 3618 ps | 0.9 v/ns | 215 mvpp | 170 ps | |
| (5) PTN5 PRESENT DECAP, ONLY TOP PATTERN FROM PTN1 | 237 ps | −68 ps | 169 ps | 3619 ps | 0.9 v/ns | 215 mvpp | 170 ps | |
| (6) PTN6 PRESENT DECAP, ONLY CENTRAL PATTERN FROM PTN1 | 221 ps | −73 ps | 148 ps | 3640 ps | 0.9 v/ns | 210 mvpp | 160 ps | · ONLY CENTRAL PATTERNS tDS JITTER EFFECT: 12 ps |
| (7) PTN7 PRESENT DECAP, ELIMINATE CENTRAL BALL FROM PTN6 | 230 ps | −67 ps | 163 ps | 3626 ps | 0.9 v/ns | 212 mvpp | 170 ps | · CENTRAL BALL tDS JITTER EFFECT: 9 ps |
| (8) PTN8 PRESENT DECAP, ELIMINATE GRID PATTERNS FROM PTN6 | 240 ps | −70 ps | 170 ps | 3618 ps | 0.9 v/ns | 216 mvpp | 170 ps | · GRID PATTERNS tDS JITTER EFFECT: 19 ps |
| (9) PTN9 PRESENT DECAP, ELIMINATE PROJECTION PATTERNS FROM PTN6 | 228 ps | −75 ps | 153 ps | 3635 ps | 0.9 v/ns | 211 mvpp | 170 ps | · PROJECTION PATTERNS tDS JITTER EFFECT: 7 ps |
| (10) PTN10 PRESENT DECAP, RIGHT PATTERNS + CENTRAL BALL FROM PTN1 | 408 ps | −78 ps | 330 ps | 3458 ps | 0.9 v/ns | 350 mvpp | 260 ps | · LEFT PATTERNS + C268 tDS JITTER EFFECT: 175 ps |
| (11) PTN11 PRESENT DECAP, ELIMINATE GRIDS AND CENTRAL BALL FROM PTN6 | 229 ps | −69 ps | 160 ps | 3629 ps | 0.9 v/ns | 220 mvpp | 170 ps | · CENTRAL BALL + GRIDS tDS JITTER EFFECT: 8 ps |
| (12) PTN12 PRESENT DECAP, ADD PATTERN TO PTN11 DOWNWARD | 217 ps | −68 ps | 149 ps | 3639 ps | 0.9 v/ns | 205 mvpp | 160 ps | · BOTTOM PATTERN tDS JITTER EFFECT: 12 ps |
| (13) PTN13 PRESENT DECAP, ADD PATTERN TO PTN6 DOWNWARD | 239 ps | −71 ps | 168 ps | 3620 ps | 0.9 v/ns | 210 mvpp | 160 ps | |
| (14) PTN14 PRESENT DECAP, ELIMINATE CENTRAL BALL AND KEEP GRIDS FROM PTN13 | 221 ps | −67 ps | 154 ps | 3633 ps | 0.9 v/ns | 211 mvpp | 170 ps | |
| (15) PTN15 PRESENT DECAP, WITHOUT GRID PATTERNS FROM PTN14 | 224 ps | −68 ps | 156 ps | 3632 ps | 0.9 v/ns | 207 mvpp | 160 ps | |
| (16) PTN16 PRESENT DECAP, ONLY BOTTOM PATTERN FROM PTN12 | 229 ps | −70 ps | 159 ps | 3629 ps | 0.9 v/ns | 214 mvpp | 160 ps | |
| (17) PTN17 PRESENT DECAP, ADD BOTTOM PATTERN TO PTN1 | 234 ps | −66 ps | 168 ps | 3619 ps | 0.9 v/ns | 211 mvpp | 165 ps | |
| (18) PTN18 (COMPARATIVE EXAMPLE) | 288 ps | −114 ps | 174 ps | 3614 ps | 0.7 v/ns | 220 mvpp | 170 ps | · PTN18⇒PTN1 tDS JITTER EFFECT: 55 ps |

CIRCUIT BOARD

BACKGROUND OF THE INVENTION

1. Field of the Invention

The present invention relates to a circuit board having, for example, a high speed and high frequency electronic circuit mounted thereon, and particularly relates to amelioration in power supply wiring wired immediately below a high speed LSI, such as a DDR memory interface.

2. Description of the Related Art

With the progress in multilayer printed board techniques, many of electronic circuit boards have a surface mount LSI mounted thereon.

Surface mount electronic circuit boards are made by planar and direct solder mounting on a surface of the circuit board. As a package using such a surface mount technique, there are ball grid array (BGA) packages and the like.

In a BGA package, solder balls (or may also be referred to as bumps) are arranged as electrodes on the back side of the package in a grid and at a regular interval. Such a BGA package is suitable for high density packaging.

Multilayer printed circuit boards are disclosed in, for example, Japanese Unexamined Patent Application Publication Nos. 9-326451, 10-223997, and 2001-53449.

SUMMARY OF THE INVENTION

In multilayer motherboards or package boards for mobile applications, where there is not a sufficient space for a wiring layer for power supply in an inner layer, wiring from a power supply ball to, for example, a DC-DC converter located in a power supply point is prone to become thinner.

As a result, because the inductance (impedance) in this area becomes larger, there is increasing influences of the jitter in a high speed IF LSI, such as a DDR memory interface (IF), and the power supply GND noises upon SSO.

Particularly in motherboards for mobile applications, since the wiring is highly dense, it is difficult to lower the power supply impedance by making the power supply wiring thicker or wiring in an inner layer.

As the speedup advances, by existing techniques, it has become technically difficult to fall within the DDR specifications (JEDEC), cut the bypass capacitor or the number of layers, or the like.

It is desirable to provide a circuit board in which the power supply impedance in the board can be reduced and the influence of the jitter and GND noises in the LSI can be reduced.

A circuit board according to an embodiment of the present invention includes a plurality of balls functioning as electrodes aligned in a grid, a power supply wiring pattern area connected to power supply terminals of an integrated circuit mounted thereon, and a feeding pattern area connected to a feeding point; the plurality of balls at least includes a first power supply ball group and a second power supply ball group connected respectively to power supply terminal arrays, aligned at a predetermined interval, of the integrated circuit, and the power supply wiring pattern area includes a first power supply connection pattern connected to the first power supply ball group, a second power supply connection pattern connected to the second power supply ball group, and at least one connection pattern connecting a part of the first power supply connection pattern and a part of the second power supply connection pattern with each other not in contact with the balls; one end portion of the first power supply connection pattern has a first connection portion connected to one end of the feeding pattern area, and a second connection portion to be connected to one electrode of a first bypass capacitor, and one end portion of the second power supply connection pattern has a third connection portion to be connected to one electrode of a second bypass capacitor.

According to embodiments of the present invention, the power supply impedance in the board can be reduced and the influence of the jitter and the GND noises in the LSI can be reduced.

BRIEF DESCRIPTION OF THE DRAWINGS

FIG. 33 illustrates evaluation results of SSO and clock jitter in simulations.

DESCRIPTION OF THE PREFERRED EMBODIMENTS

A description is given below to embodiments of the present invention in association with the drawings in the following order.

Figure 1:
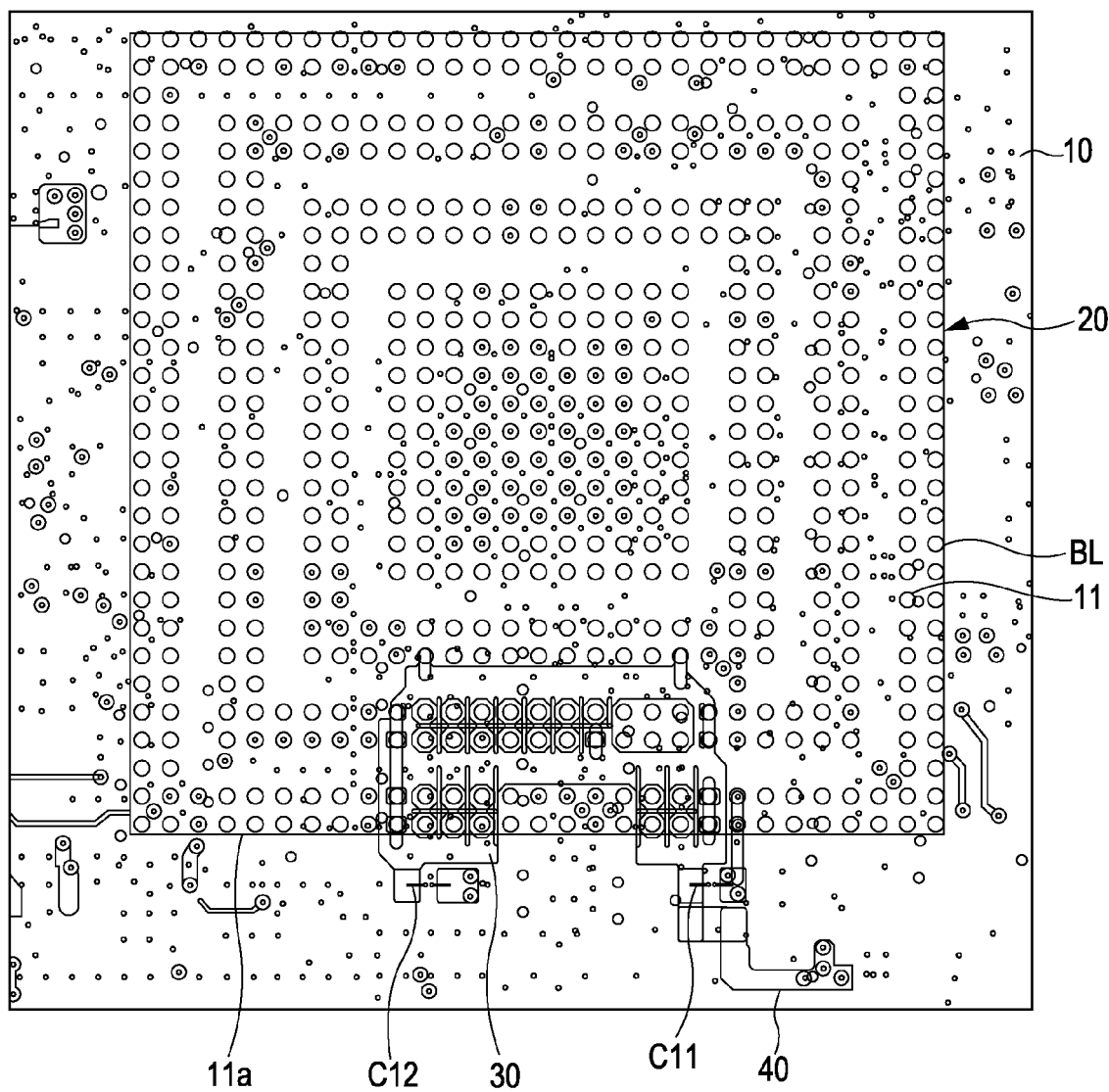
FIG. 1 is an exemplary diagram illustrating a major portion of a circuit board including power supply wiring according to an embodiment of the present invention.

1. First Embodiment (First Example of Power Supply Wiring Pattern)
2. Second Embodiment (Second Example of Power Supply Wiring Pattern)
3. Third Embodiment (Third Example of Power Supply Wiring Pattern)
4. Fourth Embodiment (Fourth Example of Power Supply Wiring Pattern)
5. Fifth Embodiment (Fifth Example of Power Supply Wiring Pattern)
6. Sixth Embodiment (Sixth Example of Power Supply Wiring Pattern)
7. Seventh Embodiment (Seventh Example of Power Supply Wiring Pattern)
8. Eighth Embodiment (Eighth Example of Power Supply Wiring Pattern)
9. Ninth Embodiment (Ninth Example of Power Supply Wiring Pattern)
10. Tenth Embodiment (Tenth Example of Power Supply Wiring Pattern)
11. Eleventh Embodiment (Eleventh Example of Power Supply Wiring Pattern)
12. Twelfth Embodiment (Twelfth Example of Power Supply Wiring Pattern)
13. Thirteenth Embodiment (Thirteenth Example of Power Supply Wiring Pattern)
14. Fourteenth Embodiment (Fourteenth Example of Power Supply Wiring Pattern)
15. Fifteenth Embodiment (Fifteenth Example of Power Supply Wiring Pattern)
16. Sixteenth Embodiment (Sixteenth Example of Power Supply Wiring Pattern)
17. Comparative Example FIG. 1 is an exemplary diagram illustrating a major portion of a circuit board including power supply wiring according to an embodiment of the present invention.

A circuit board 10 is formed as a BGA package using a surface mount technique for solder mounting on the board surface planarly and directly.

In the circuit board 10, solder balls (or may also be referred to as bumps) BL having an electrode function as a first electrode layer of the package are arranged in a predetermined pattern in a grid and at a regular interval.

The circuit board 10 has a ball array arrangement region 11 formed such that the plurality of balls BL becomes in a square like form as a whole in correspondence with a form of a rectangular integrated circuit (LSI) 20.

On the ball array arrangement region 11, the LSI 20 is placed in connection with the balls BL corresponding to its electrode terminals and signal terminals.

The ball array arrangement region 11 has a power supply wiring pattern area 30 having a characteristic pattern of the present embodiment formed on one of the edges, on an edge 11a at the bottom of the four edges of the rectangular form in FIG. 1.

The circuit board 10 is connected to a feeding point, not shown, and has a feeding pattern area 40 formed to feed the power supply wiring pattern area 30.

In the circuit board 10, a first bypass capacitor C11 and a second bypass capacitor C12 to effectively separate a high frequency power supply current are connected to the power supply wiring pattern area 30.

The circuit board 10 has, as the LSI 20, a high speed LSI, such as a DDR memory interface, mounted thereon.

Figure 2:
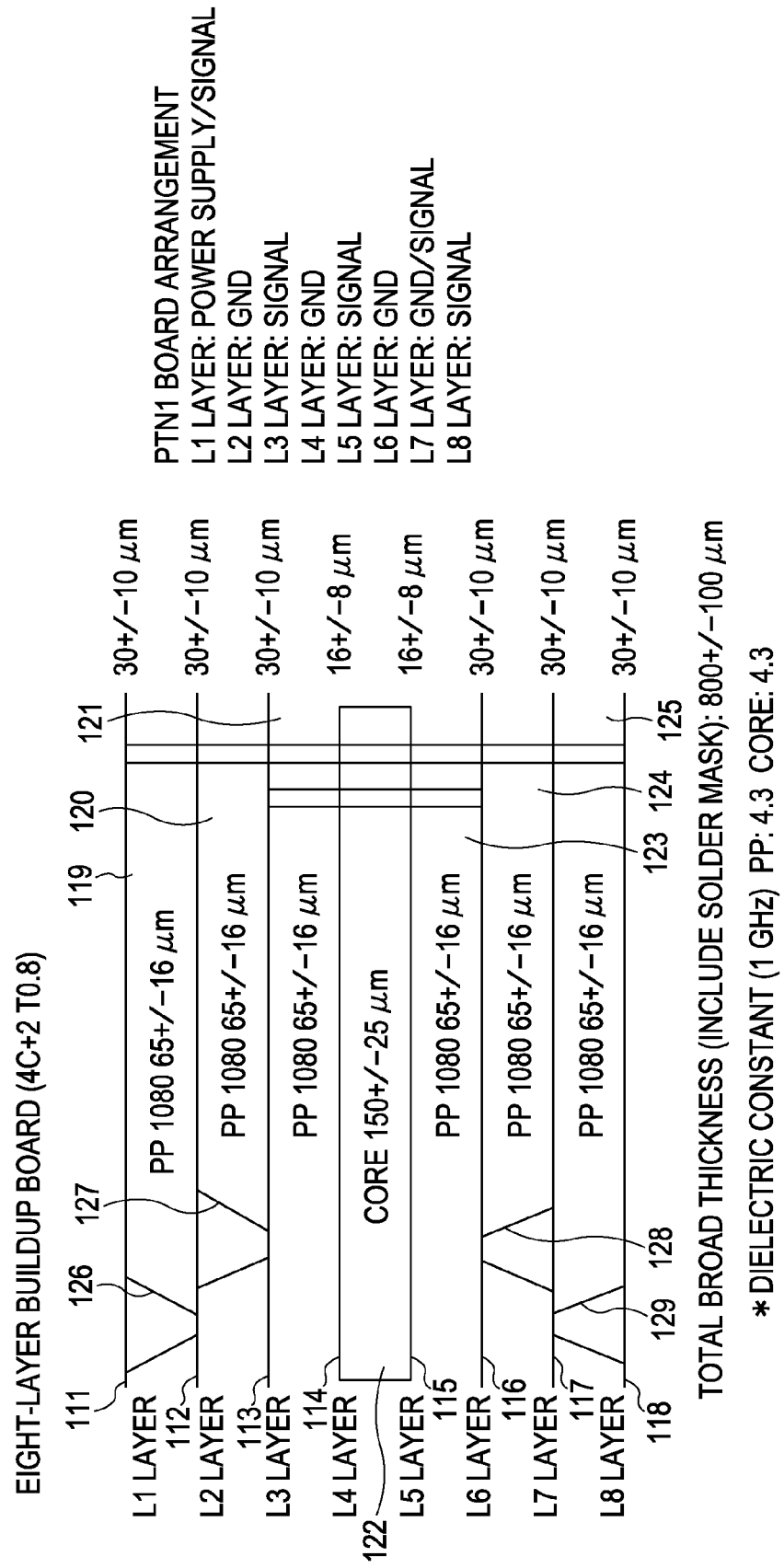
FIG. 2 illustrates a wiring structure of the circuit board according to the embodiment.

FIG. 2 illustrates a wiring structure of the circuit board according to the present embodiment.

The circuit board 10 in FIG. 2 illustrates a configuration example of the motherboard layer, and is formed as an eight-layer buildup board.

The circuit board 10 has an L1 layer 111 on the surface side, an L2 layer 112, an L3 layer 113, an L4 layer 114, an L5 layer 115, an L6 layer 116, an L7 layer 117, and an L8 layer 118.

The L1 layer 111 is formed as a layer immediately below the LSI 20, and the ball array arrangement region 11, the power supply wiring pattern area 30, the feeding pattern area 40, and the like are formed therein.

The L1 layer 111 is formed as a power supply and signal layer.

Between the L1 layer 111 and the L2 layer 112, an insulating layer 119 is formed.

Between the L2 layer 112 and the L3 layer 113, an insulating layer 120 is formed.

Between the L3 layer 113 and the L4 layer 114, an insulating layer 121 is formed.

Between the L4 layer 114 and the L5 layer 115, a core layer 122 is formed.

Between the L5 layer 115 and the L6 layer 116, an insulating layer 123 is formed.

Between the L6 layer 116 and the L7 layer 117, an insulating layer 124 is formed.

Between the L7 layer 117 and the L8 layer 118, an insulating layer 125 is formed.

The L2 layer 112 is formed as, for example, a ground (GND) layer. The L2 layer 112 is formed as an entire ground GND layer.

The L1 layer 111 and the L2 layer 112 are connected through a via 126 formed in the insulating layer 119.

The L3 layer 113 is formed as a signal layer.

The L2 layer 112 and the L3 layer 113 are connected through a via 127 formed in the insulating layer 120.

The L4 layer 114 is formed as, for example, a ground GND layer.

The L5 layer 115 is formed as a signal layer.

The L6 layer 116 is formed as a ground GND layer. The L7 layer 117 is formed as a ground GND and signal layer.

The L6 layer 116 and the L7 layer 117 are connected through a via 128 formed in the insulating layer 124.

The L8 layer 118 is formed as a signal layer.

The L7 layer 117 and the L8 layer 118 are connected through a via 129 formed in the insulating layer 125.

The dielectric constants of the insulating layers 119 to 121, 123 to 125 and the core layer 122 are 4.3 in terms of 1 GHz of the frequency.

A description is given below to a plurality of examples of a power supply wiring pattern in the circuit board 10 according to the embodiments, and then a description is given to simulation results of each power supply wiring pattern.

1. First Embodiment

Figure 3:
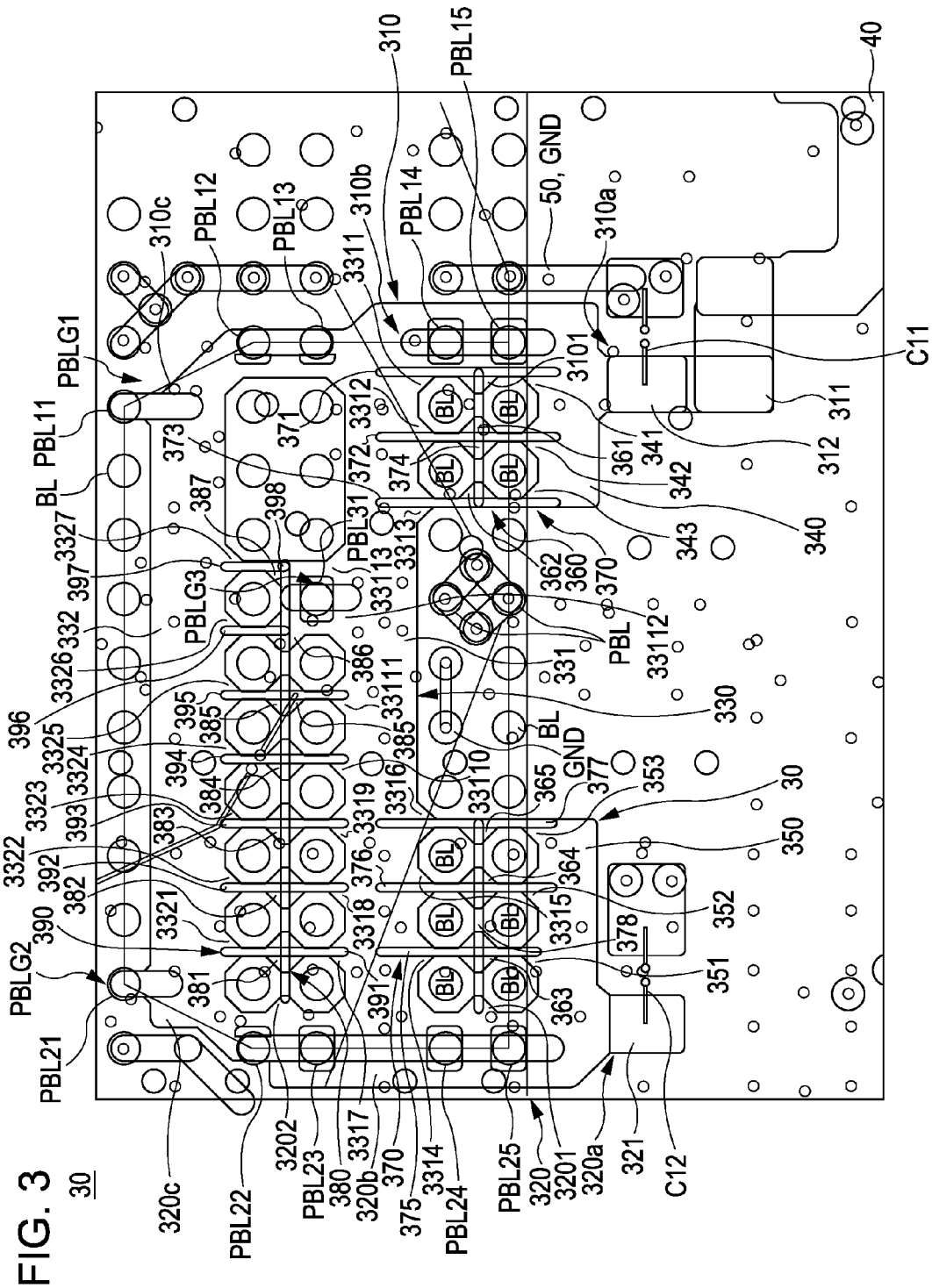
FIG. 3 illustrates a power supply wiring pattern area according to a first embodiment of the present invention.

FIG. 3 illustrates a power supply wiring pattern area according to a first embodiment of the present invention.

The circuit board 10 has, as illustrated in FIGS. 1 and 3, the plurality of balls BL functioning as electrodes aligned in a grid and the power supply wiring pattern area 30 connected to power supply terminals of the LSI 20 to be mounted in a predetermined region immediately below the LSI 20 and its vicinity.

The circuit board 10 further has the feeding pattern area 40, which is connected to a feeding point, not shown, and is to feed the power supply wiring pattern area 30.

The circuit board 10 has the first bypass capacitor C11 and the second bypass capacitor C12 mounted thereon.

The circuit board 10 also has, as illustrated in FIG. 3, a ground pattern area 50.

As a feeding portion, examples may include a DC-DC converter or the like.

In the present embodiment, the plurality of balls BL at least includes a first power supply ball group PBLG1 and a second power supply ball group PBLG2 connected respectively to a first power supply terminal array and a second power supply terminal array, not shown, aligned at a predetermined interval of the LSI 20.

In FIG. 3, the first power supply ball group PBLG1 is formed by including power supply balls PBL11 to PBL15.

Similarly, the second power supply ball group PBLG2 is formed by including power supply balls PBL21 to PBL25.

The circuit board 10 in FIG. 3 also has a third power supply ball group PBLG3 formed between the regions where the first power supply ball group PBLG1 and the second power supply ball group PBLG2 are arranged.

The third power supply ball group PBLG3 is formed by including a power supply ball PBL31.

The power supply wiring pattern area 30 has, as illustrated in FIG. 3, a first power supply connection pattern 310 connected to the first power supply ball group PBLG1 and a second power supply connection pattern 320 connected to the second power supply ball group PBLG2.

The power supply wiring pattern area 30 has at least one connection pattern 330 connecting a part of the first power supply connection pattern 310 and a part of the second power supply connection pattern 320 with each other not in contact with the balls BL.

In the power supply wiring pattern area 30 in FIG. 3, the first power supply connection pattern 310 and the second power supply connection pattern 320 are formed as a strip form patterns having a predetermined width and in parallel spaced at a predetermined interval.

An end portion 310a of the first power supply connection pattern 310 has a first connection portion 311 connected to an end of the feeding pattern area 40 and a second connection portion 312 to be connected to one of the electrodes of the first bypass capacitor C11.

In an example of FIG. 3, the first connection portion 311 is formed on the endmost side in the one end portion 310a of the first power supply connection pattern 310.

An end portion 320a of the second power supply connection pattern 320 has a third connection portion 321 to be connected to one of the electrodes of the second bypass capacitor C12.

The power supply wiring pattern area 30 in FIG. 3 has, as the at least one connection pattern 330, a first connection pattern 331 and a second connection pattern 332.

The first connection pattern 331 is formed as a strip form pattern having a predetermined width and connecting a longitudinal central portion 310b of the first power supply connection pattern 310 and a longitudinal central portion 320b of the second power supply connection pattern 320.

The second connection pattern 332 is formed as a strip form pattern having a predetermined width and connecting the other end portion 310c of the first power supply connection pattern 310 and the other end portion 320c of the second power supply connection pattern 320.

The first connection pattern 331 and the second connection pattern 332 are formed to be approximately in parallel, and the widths are formed to be approximately identical.

In the power supply wiring pattern area 30 in FIG. 3, as the at least one connection pattern 330, the first connection pattern 331 is connected to the power supply ball PBL31 of the third power supply ball group PBLG3.

As just described, the first connection pattern 331 connects the longitudinal central portion 310b of the first power supply connection pattern 310 and the longitudinal central portion 320b of the second power supply connection pattern 320, and thus it is possible to maintain an approximately shortest return path to the second bypass capacitor C12.

That is, since the first connection pattern 331 is directly connected to the third connection portion 321 formed in the first power supply connection pattern 310, the power supply wiring pattern area 30 is possible to maintain the approximately shortest return path to the second bypass capacitor C12.

Similarly, since the second connection pattern 332 is directly connected to the third connection portion 321 formed in the first power supply connection pattern 310, the power supply wiring pattern area 30 is possible to maintain an approximately shortest return path to the second bypass capacitor C12.

The first connection pattern 331 has a larger effect of making the return path shortest than the second connection pattern 332.

The circuit board 10 in FIG. 3 further has a first extended pattern 340 and a second extended pattern 350.

The first extended pattern 340 is formed so as to extend in a predetermined length from the one end portion 310a of the first power supply connection pattern 310 towards the second power supply connection pattern 320 in parallel with the first connection pattern 331.

The second extended pattern 350 is formed so as to extend in a predetermined length from the one end portion 320a of the second power supply connection pattern 320 towards the first power supply connection pattern 310 in parallel with the first connection pattern 331.

In the power supply wiring pattern area 30 in FIG. 3, the plurality of balls BL is aligned in regions between the first connection pattern 331 and the first extended pattern 340 and between the first connection pattern 331 and the second extended pattern 350.

In the power supply wiring pattern area 30 in FIG. 3, the plurality of balls BL is basically aligned so as to form two rows ten columns.

Among the plurality of balls BL, some are formed as a ground electrode GND and a power supply electrode.

Then, on each facing edge of the first connection pattern 331 and the first extended pattern 340 and on each facing edge of the first connection pattern 331 and the second extended pattern 350, a plurality of projection patterns is formed along the ball alignment not in contact with the balls BL.

On the edges of the first connection pattern 331 facing the first extended pattern 340, three projection patterns 3311, 3312, and 3313 in a triangular form are formed so as not to contact the balls BL.

In the power supply wiring pattern area 30 in FIG. 3, between the one end portion 310a and the central portion 310b of the first power supply connection pattern 310, one projection pattern 3101 in a triangular form is formed towards the second power supply connection pattern 320 so as not to contact the balls BL.

On the edge of the first extended pattern 340 facing the first connection pattern 331, three projection patterns 341, 342, and 343 in a triangular form are formed so as not to contact the balls BL.

On the edge of the first connection pattern 331 facing the second extended pattern 350, three projection patterns 3314, 3315, and 3316 in a triangular form are formed so as not to contact the balls BL.

In the power supply wiring pattern area 30 in FIG. 3, between the one end portion 320a and the central portion 320b of the second power supply connection pattern 320, one projection pattern 3201 in a triangular form is formed towards the second power supply connection pattern 320 so as not to contact the balls BL.

On the edge of the second extended pattern 350 facing the first connection pattern 331, three projection patterns 351, 352, and 353 in a triangular form are formed so as not to contact the balls BL.

Between each facing edge of the first connection pattern 331 and the first extended pattern 340 and between each facing edge of the first connection pattern 331 and the second extended pattern 350, a plurality of spacing patterns 360 is formed along the ball alignment not in contact with the balls BL.

Between the projection pattern 3312 of the first connection pattern 331 and the projection pattern 342 of the first extended pattern 340 facing with each other, a spacing pattern 361 is formed in a square form.

Between the projection pattern 3313 of the first connection pattern 331 and the projection pattern 343 of the first extended pattern 340 facing with each other, a spacing pattern 362 is formed in a square form.

Between the projection pattern 3314 of the first connection pattern 331 and the projection pattern 351 of the second extended pattern 350 facing with each other, a spacing pattern 363 is formed in a square form.

Between the projection pattern 3315 of the first connection pattern 331 and the projection pattern 352 of the second extended pattern 350 facing with each other, a spacing pattern 364 is formed in a square form.

Between the projection pattern 3316 of the first connection pattern 331 and the projection pattern 353 of the second extended pattern 350 facing with each other, a spacing pattern 365 is formed in a square form.

The facing edges of the first connection pattern 331 and the first extended pattern 340 and the facing edges of the first connection pattern 331 and the second extended pattern 350 are connected by a plurality of grid patterns 370 not in contact with the balls BL.

The facing edges of the first connection pattern 331 and the first extended pattern 340 are connected in a grid by patterns 371, 372, and 373 formed in parallel and a pattern 374 orthogonal to them.

Specifically, the pattern 371 is formed by overlapping the first power supply connection pattern 310.

The pattern 372 connects the first connection pattern 331 and the first extended pattern 340 through the projection pattern 3312, the spacing pattern 361, and the projection pattern 342.

The pattern 373 connects the first connection pattern 331 and the first extended pattern 340 through the projection pattern 3313, the spacing pattern 362, and the projection pattern 343.

The pattern 374 connects the spacing patterns 362 and 361, the projection pattern 3101, and the patterns 371 to 373.

The facing edges of the first connection pattern 331 and the second extended pattern 350 are connected in a grid by patterns 375, 376, and 377 formed in parallel and a pattern 378 orthogonal to them.

The pattern 375 connects the first connection pattern 331 and the second extended pattern 350 through the projection pattern 3314, the spacing pattern 363, and the projection pattern 351.

The pattern 376 connects the first connection pattern 331 and the second extended pattern 350 through the projection pattern 3315, the spacing pattern 364, and the projection pattern 352.

The pattern 377 connects the first connection pattern 331 and the second extended pattern 350 through the projection pattern 3316, the spacing pattern 365, and the projection pattern 353.

The pattern 378 connects the spacing patterns 365, 364, and 363, the projection pattern 3201, and the patterns 375 to 377.

In the power supply wiring pattern area 30 in FIG. 3, a plurality of balls BL is aligned in regions between the second connection pattern 332 and an edge on the side opposite from the edge of the first connection pattern 331 facing the first extended pattern 340 and the second extended pattern 350.

In the power supply wiring pattern area 30 in FIG. 3, the plurality of balls BL is basically aligned so as to form two rows ten columns.

Among the plurality of balls BL, some are formed as a ground electrode and a power supply electrode.

Then, on each facing edge of the first connection pattern 331 and the second connection pattern 332, a plurality of projection patterns is formed along the ball alignment not in contact with the balls BL.

On the edge of the first connection pattern 331 facing the second connection pattern 332, seven projection patterns 3317, 3318, 3319, 33110, 33111, 33112, and 33113 in a triangular form are formed so as not to contact the balls BL.

In the power supply wiring pattern area 30 in FIG. 3, between the one end portion 320a and the central portion 320b of the second power supply connection pattern 320, one projection pattern 3202 in a triangular form is formed towards the first power supply connection pattern 310 so as not to contact the balls BL.

On the edge of the second connection pattern 332 facing the first connection pattern 331, seven projection patterns 3321, 3322, 3323, 3324, 3325, 3326, and 3327 in a triangular form are formed so as not to contact the balls BL.

Between each facing edge of the first connection pattern 331 and the second connection pattern 332, a plurality of spacing patterns 380 is formed along the ball alignment not in contact with the balls BL.

Between the projection pattern 3317 of the first connection pattern 331 and the projection pattern 3321 of the second connection pattern 332 facing with each other, a spacing pattern 381 is formed in a square form.

Between the projection pattern 3318 of the first connection pattern 331 and the projection pattern 3322 of the second connection pattern 332 facing with each other, a spacing pattern 382 is formed in a square form.

Between the projection pattern 3319 of the first connection pattern 331 and the projection pattern 3323 of the second connection pattern 332 facing with each other, a spacing pattern 383 is formed in a square form.

Between the projection pattern 33110 of the first connection pattern 331 and the projection pattern 3324 of the second connection pattern 332 facing with each other, a spacing pattern 384 is formed in a square form.

Between the projection pattern 33111 of the first connection pattern 331 and the projection pattern 3325 of the second connection pattern 332 facing with each other, a spacing pattern 385 is formed in a square form.

Between the projection pattern 33112 of the first connection pattern 331 and the projection pattern 3326 of the second connection pattern 332 facing with each other, a spacing pattern 386 is formed in a square form.

Between the projection pattern 33113 of the first connection pattern 331 and the projection pattern 3327 of the second connection pattern 332 facing with each other, a spacing pattern 387 is formed in a square form.

Each facing edge of the first connection pattern 331 and the second connection pattern 332 is connected by a plurality of grid patterns 390, which are not in contact with the balls BL.

Each facing edge of the first connection pattern 331 and the second connection pattern 332 is connected in a grid by patterns 391, 392, 393, 394, 395, 396, and 397 formed in parallel and a pattern 398 orthogonal to them.

The pattern 391 connects the first connection pattern 331 and the second connection pattern 332 through the projection pattern 3317, the spacing pattern 381, and the projection pattern 3321.

The pattern 392 connects the first connection pattern 331 and the second connection pattern 332 through the projection pattern 3318, the spacing pattern 382, and the projection pattern 3322.

The pattern 393 connects the first connection pattern 331 and the second connection pattern 332 through the projection pattern 3319, the spacing pattern 383, and the projection pattern 3323.

The pattern 394 connects the first connection pattern 331 and the second connection pattern 332 through the projection pattern 33110, the spacing pattern 384, and the projection pattern 3324.

The pattern 395 connects the first connection pattern 331 and the second connection pattern 332 through the projection pattern 33111, the spacing pattern 385, and the projection pattern 3325.

The pattern 396 connects the first connection pattern 331 and the second connection pattern 332 through the projection pattern 33112, the spacing pattern 386, and the projection pattern 3326.

The pattern 397 connects the first connection pattern 331 and the second connection pattern 332 through the projection pattern 33113, the spacing pattern 387, and the projection pattern 3327.

The pattern 398 connects the spacing patterns 387, 386, 385, 384, 383, 382, and 381, the projection pattern 3202, and the patterns 391 to 397.

The circuit board 10 having the above configuration, in a high speed memory interface board (six-layer board or eight-layer board), such as a DDR, and an LSI package board, has additional wiring of the power supply wiring immediately below the LSI 20 (L1 layer) in a grid between the balls.

With that, by securing a more area for power supply in a smaller number of layers, the power supply to the balls BL is enhanced and the effect of the bypass capacitors is improved, and thus the power supply GND impedance in the board is reduced and the inductance characteristics are improved. Then, this reduces the jitter and the power supply GND noises in the high speed IF LSI 20, such as a DDR memory interface (L2 layer is a solid GND).

The present circuit board 10 has the pattern forms provided with the effective power supply characteristics and bypass capacitor characteristics for the minimally small pattern area only of the L1 layer of the multilayer board and is capable of securing a clearance of 75 μm.

With that, it becomes possible to satisfy the characteristics with one bypass capacitor.

As just described, the circuit board 10 according to the present first embodiment can reduce the power supply GND impedance in the motherboard.

The SSO jitter and the clock jitter in the high speed IF LSI 20, such as a DDR memory interface, can be thus reduced.

The power supply GND noises and the electromagnetic interference (EMI) may be reduced.

Motherboards and external bypass capacitors can be cut, and consequently the costs may be cut.

The number of board layers can be cut, for example, from an eight-layer board to a six-layer board, and consequently the costs may be cut.

By defining the circuit board 10 according to the first embodiment as a basic pattern PTN1, examples of configurations of various power supply wiring pattern areas made by modifying it are shown below as second to sixteenth embodiments.

In the description below, the configuration is described first, and then the effects of the various power supply wiring patterns are described by comparison as simulation results.

In the simulations described later, a pattern without the second bypass capacitor C12 of the basic pattern PTN1 is defined as PTN2.

2. Second Embodiment

Figure 4:
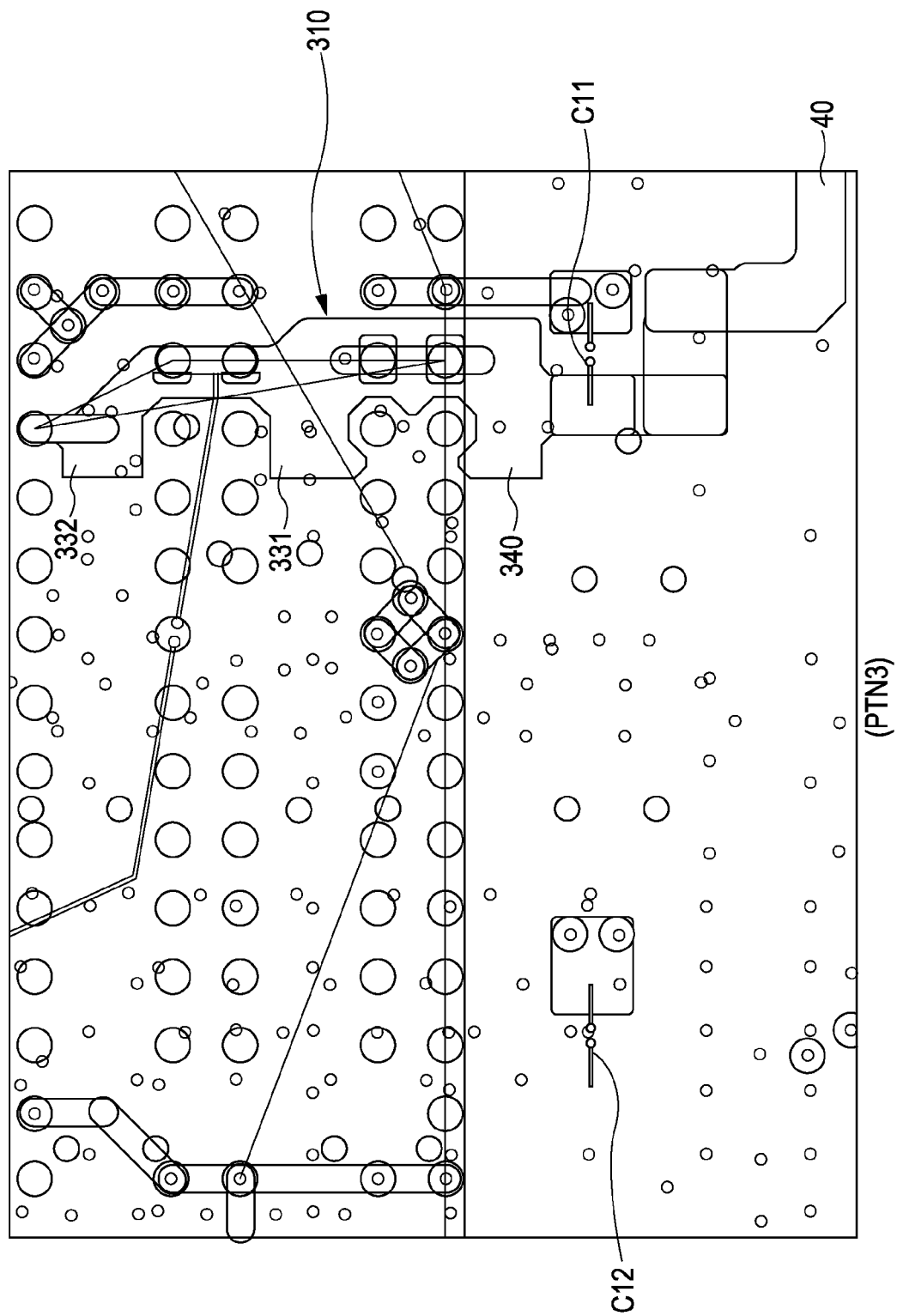
FIG. 4 illustrates a power supply wiring pattern area according to a second embodiment of the present invention.

FIG. 4 illustrates a power supply wiring pattern area according to a second embodiment of the present invention.

A power supply wiring pattern area 30A according to the present second embodiment only has a part of the first power supply connection pattern 310, the first connection pattern 331, the second connection pattern 332, and the first extended pattern 340.

The power supply wiring pattern area 30A does not have the second power supply connection pattern 320, and so does not have the third connection portion 321 for the second bypass capacitor C12.

This pattern is defined as PTN3.

3. Third Embodiment

Figure 5:
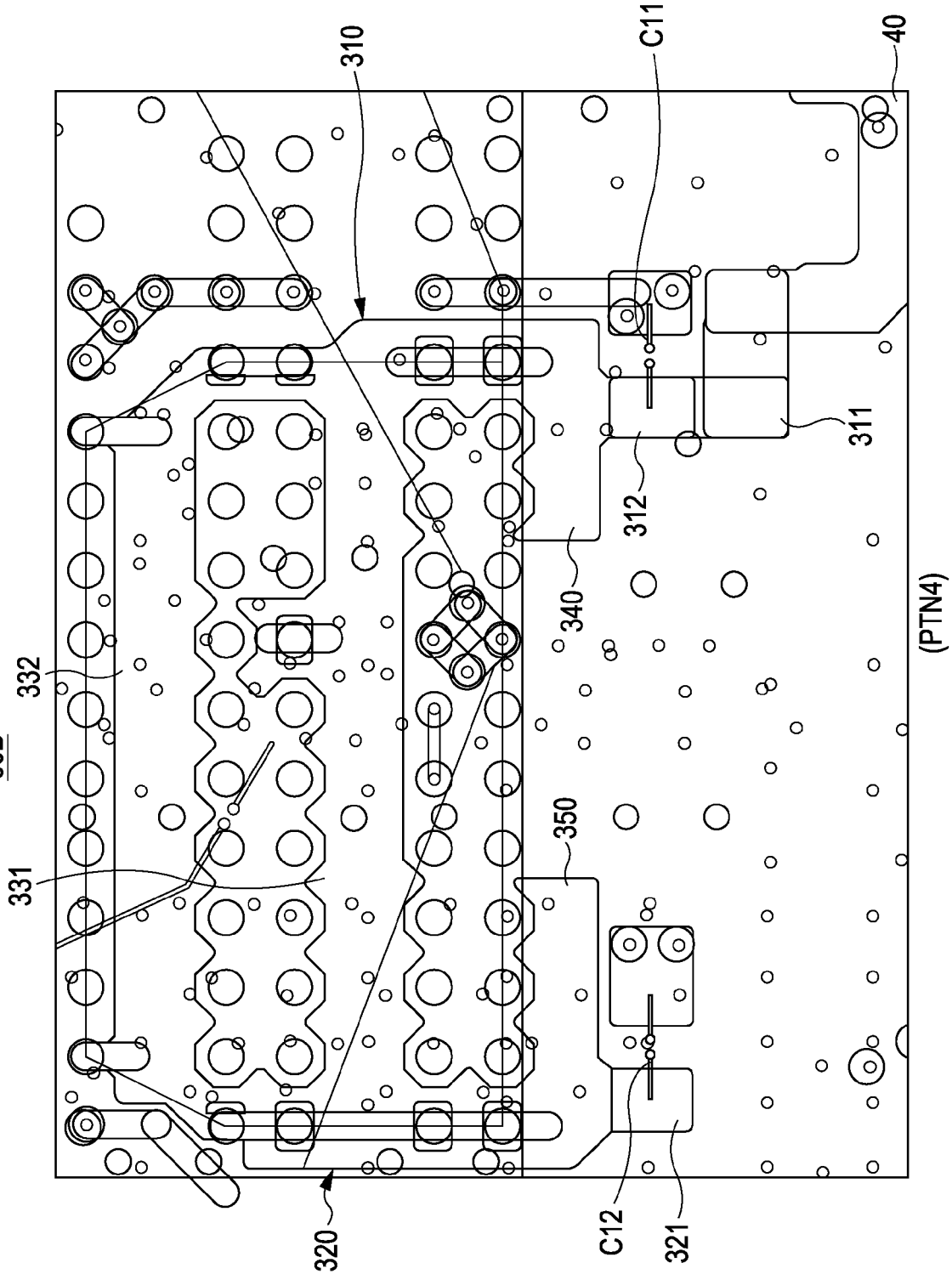
FIG. 5 illustrates a power supply wiring pattern area according to a third embodiment of the present invention.

FIG. 5 illustrates a power supply wiring pattern area according to a third embodiment of the present invention.

A power supply wiring pattern area 30B according to the present third embodiment has a configuration in which the spacing patterns 360 and 380 and the grid patterns 370 and 390 are eliminated from the power supply wiring pattern area 30 in FIG. 3.

This pattern is defined as PTN4.

4. Fourth Embodiment

Figure 6:
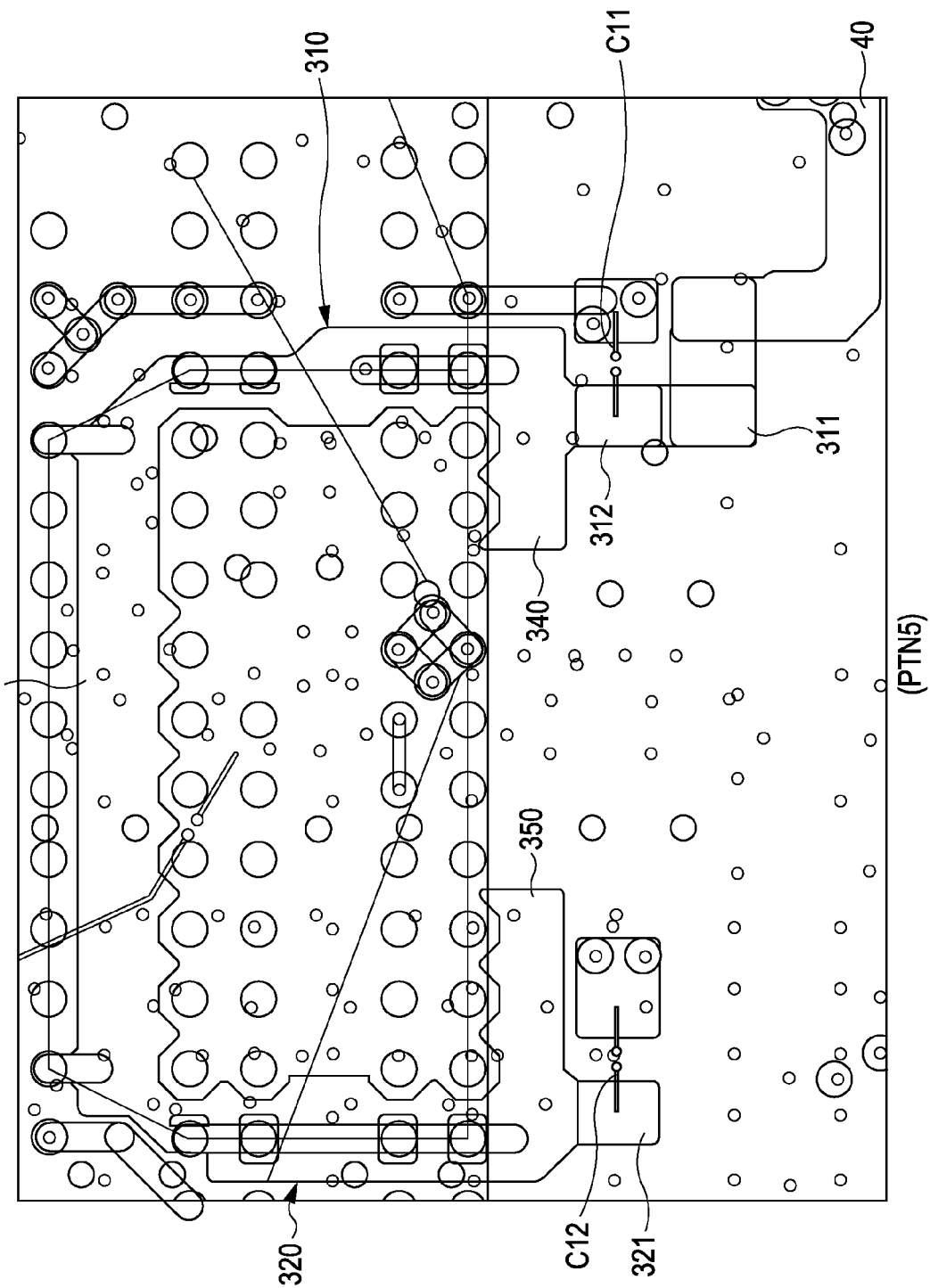
FIG. 6 illustrates a power supply wiring pattern area according to a fourth embodiment of the present invention.

FIG. 6 illustrates a power supply wiring pattern area according to a fourth embodiment of the present invention.

A power supply wiring pattern area 30C according to the present fourth embodiment has a configuration in which the first connection pattern 331, the spacing patterns 360 and 380, and the grid patterns 370 and 390 are eliminated from the power supply wiring pattern area 30 in FIG. 3.

This pattern is defined as PTN5.

5. Fifth Embodiment

Figure 7:
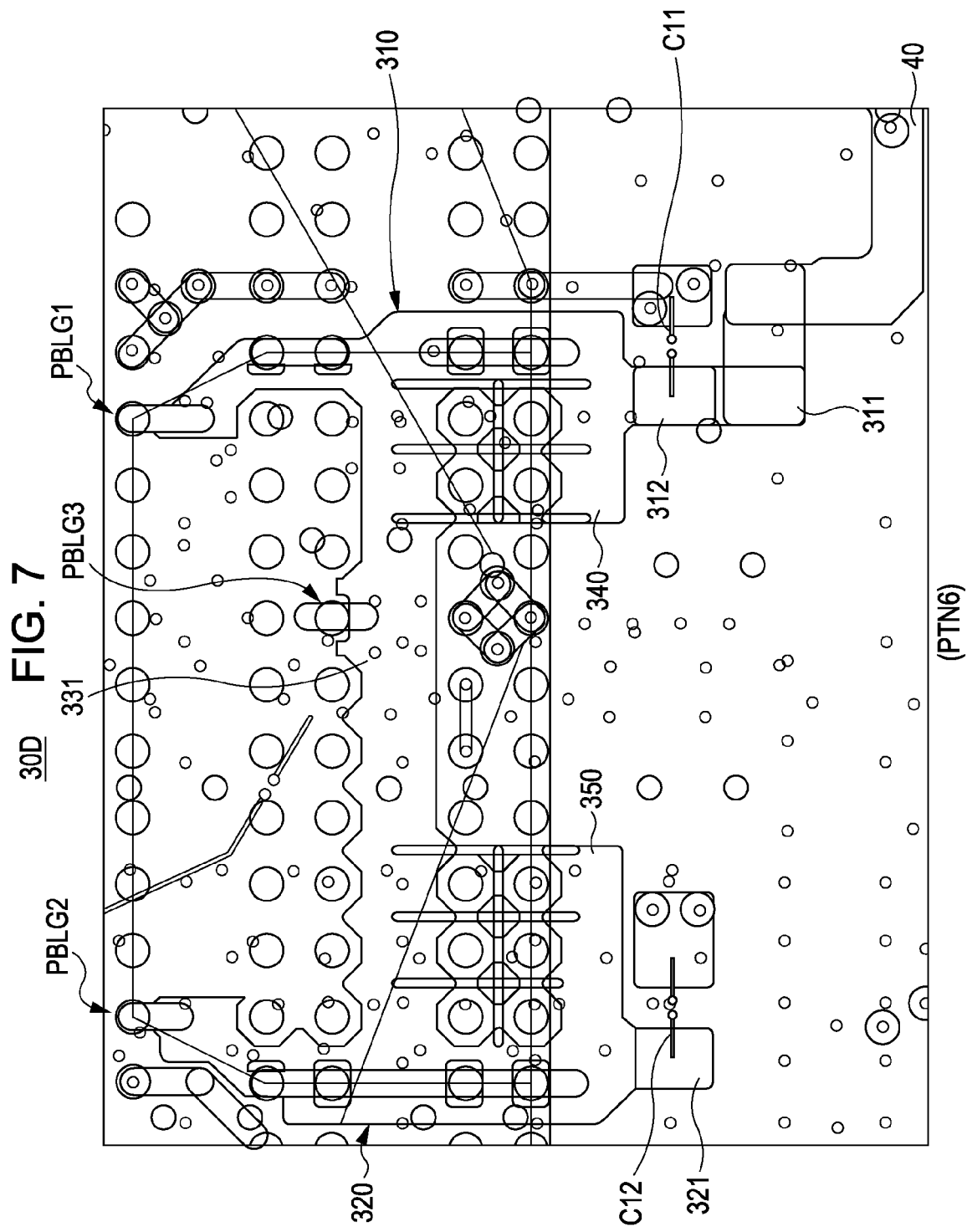
FIG. 7 illustrates a power supply wiring pattern area according to a fifth embodiment of the present invention.

FIG. 7 illustrates a power supply wiring pattern area according to a fifth embodiment of the present invention.

Figure 8:
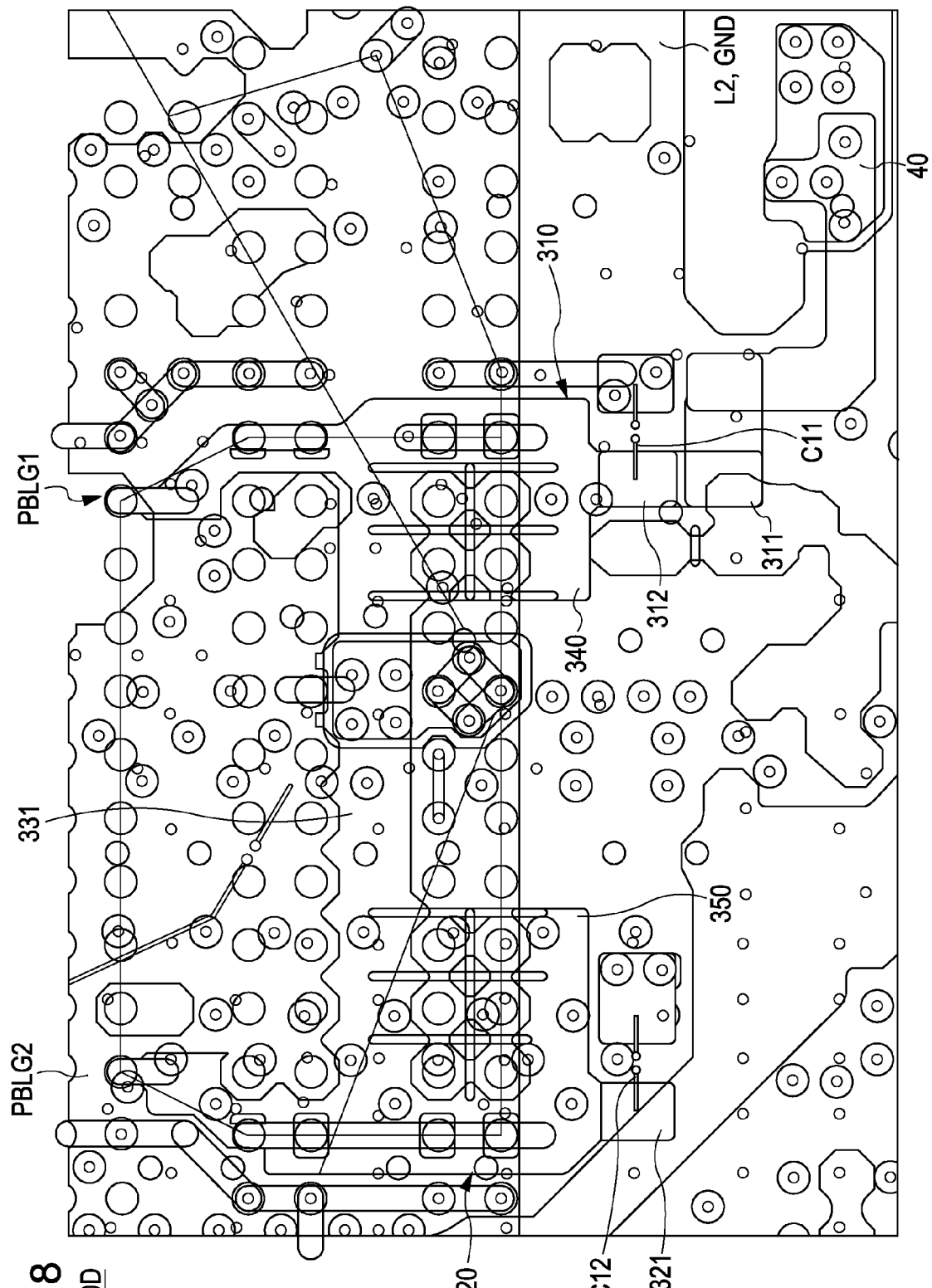
FIG. 8 illustrates an L1 layer and an L2 layer (GND), in overlap, of the power supply wiring pattern area according to the fifth embodiment.

FIG. 8 illustrates an L1 layer and an L2 layer (GND), in overlap, of the power supply wiring pattern area according to the fifth embodiment.

A power supply wiring pattern area 30D according to the present fifth embodiment has a configuration in which the second connection pattern 332, the spacing patterns 380, and the grid patterns 390 are eliminated from the power supply wiring pattern area 30 in FIG. 3.

This pattern is defined as PTN6.

6. Sixth Embodiment

Figure 9:
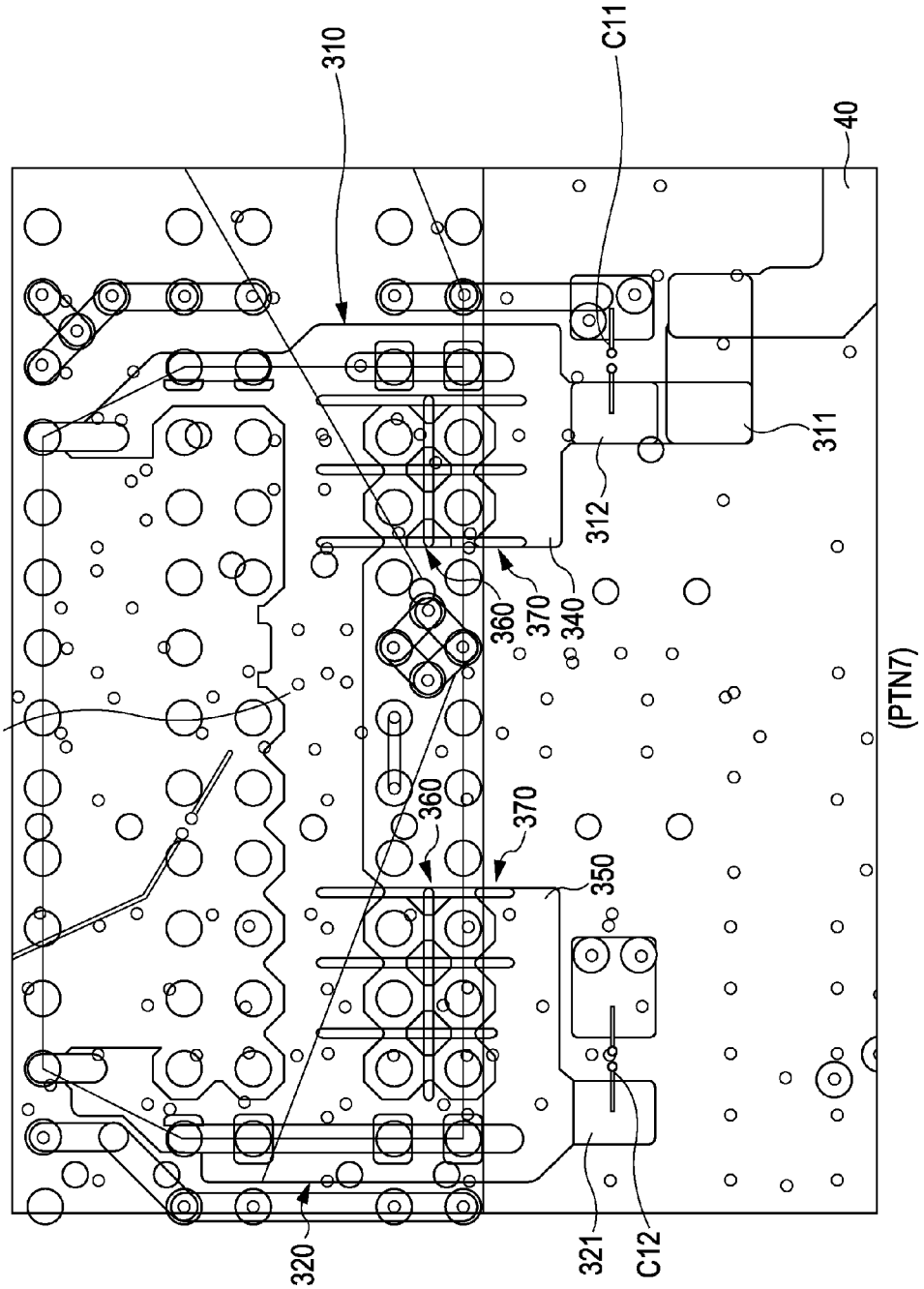
FIG. 9 illustrates a power supply wiring pattern area according to a sixth embodiment of the present invention.

FIG. 9 illustrates a power supply wiring pattern area according to a sixth embodiment of the present invention.

A power supply wiring pattern area 30E according to the present sixth embodiment has a configuration in which the connection with the power supply ball PBL31 of the third power supply ball group PBLG3 is eliminated from the power supply wiring pattern area 30D in FIG. 7.

This pattern is defined as PTN7.

7. Seventh Embodiment

Figure 10:
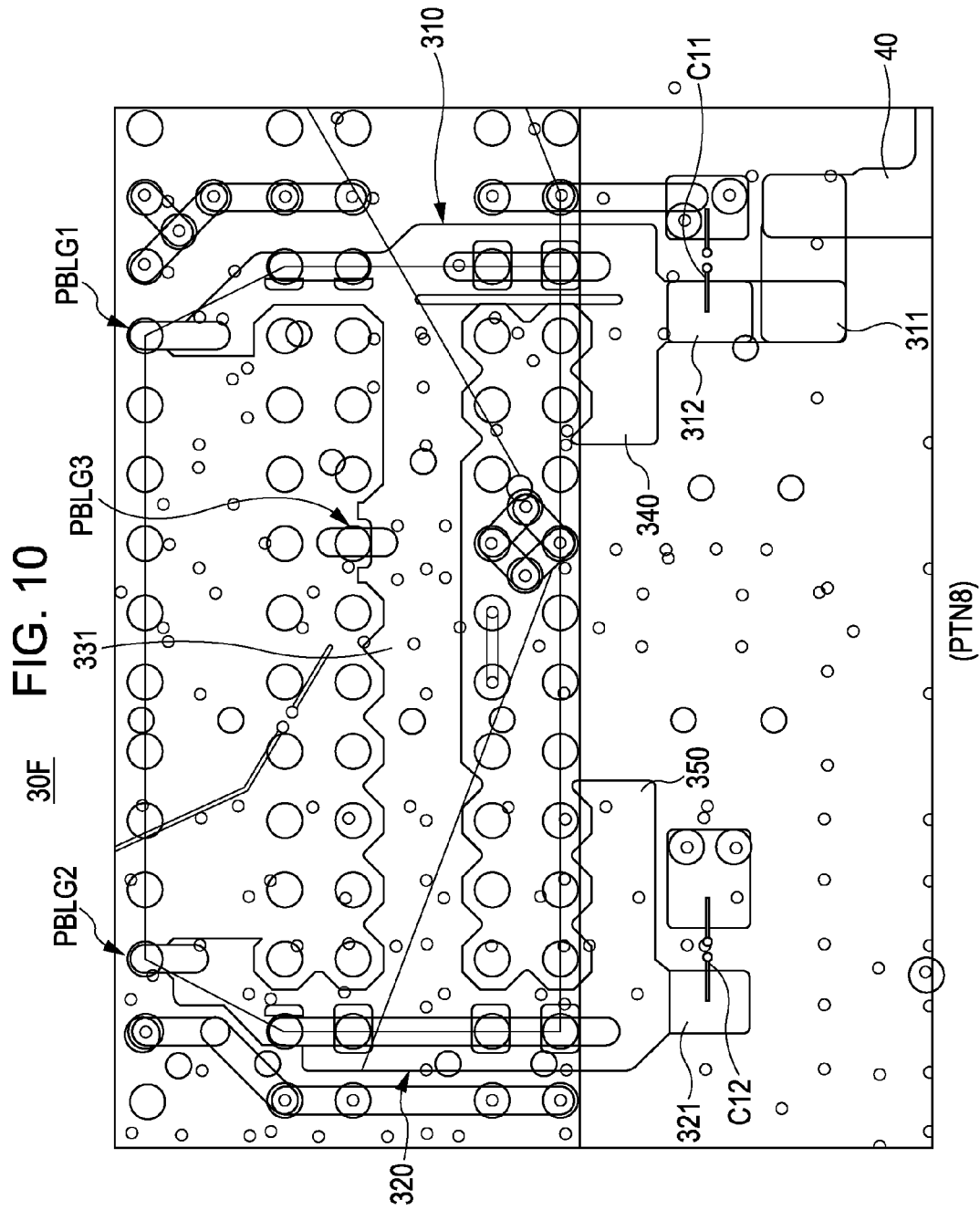
FIG. 10 illustrates a power supply wiring pattern area according to a seventh embodiment of the present invention.

FIG. 10 illustrates a power supply wiring pattern area according to a seventh embodiment of the present invention.

A power supply wiring pattern area 30F according to the present seventh embodiment has a configuration in which the spacing patterns 360 and the grid patterns 370 are eliminated from the power supply wiring pattern area 30D in FIG. 7.

This pattern is defined as PTN8.

8. Eighth Embodiment

Figure 11:
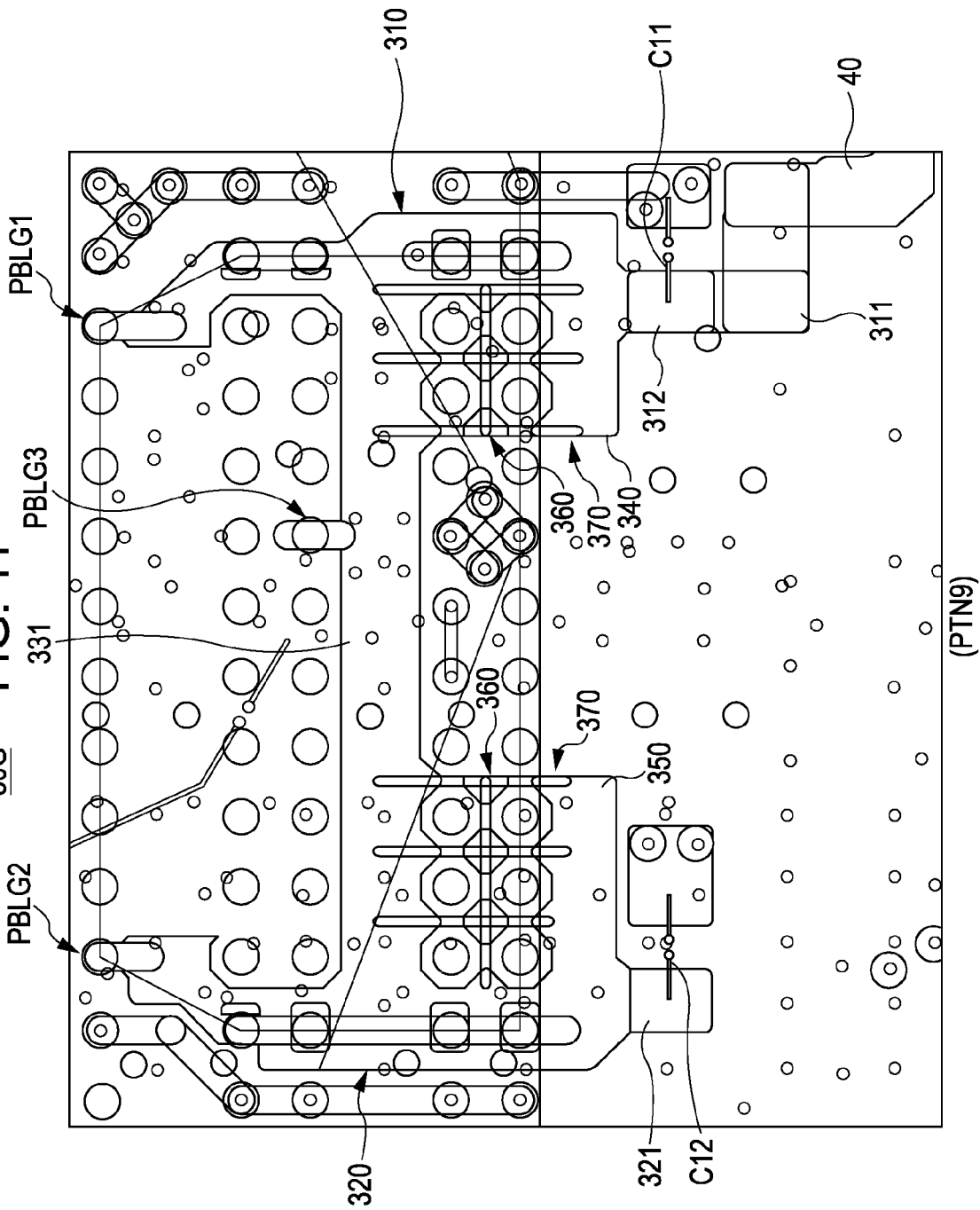
FIG. 11 illustrates a power supply wiring pattern area according to an eighth embodiment of the present invention.

FIG. 11 illustrates a power supply wiring pattern area according to an eighth embodiment of the present invention.

A power supply wiring pattern area 30G according to the present eighth embodiment has a configuration in which the projection patterns 3317 to 33113 on the edges of the first connection pattern 331 facing the second connection pattern 332 are eliminated from the power supply wiring pattern area 30D in FIG. 7.

This pattern is defined as PTN9.

9. Ninth Embodiment

Figure 12:
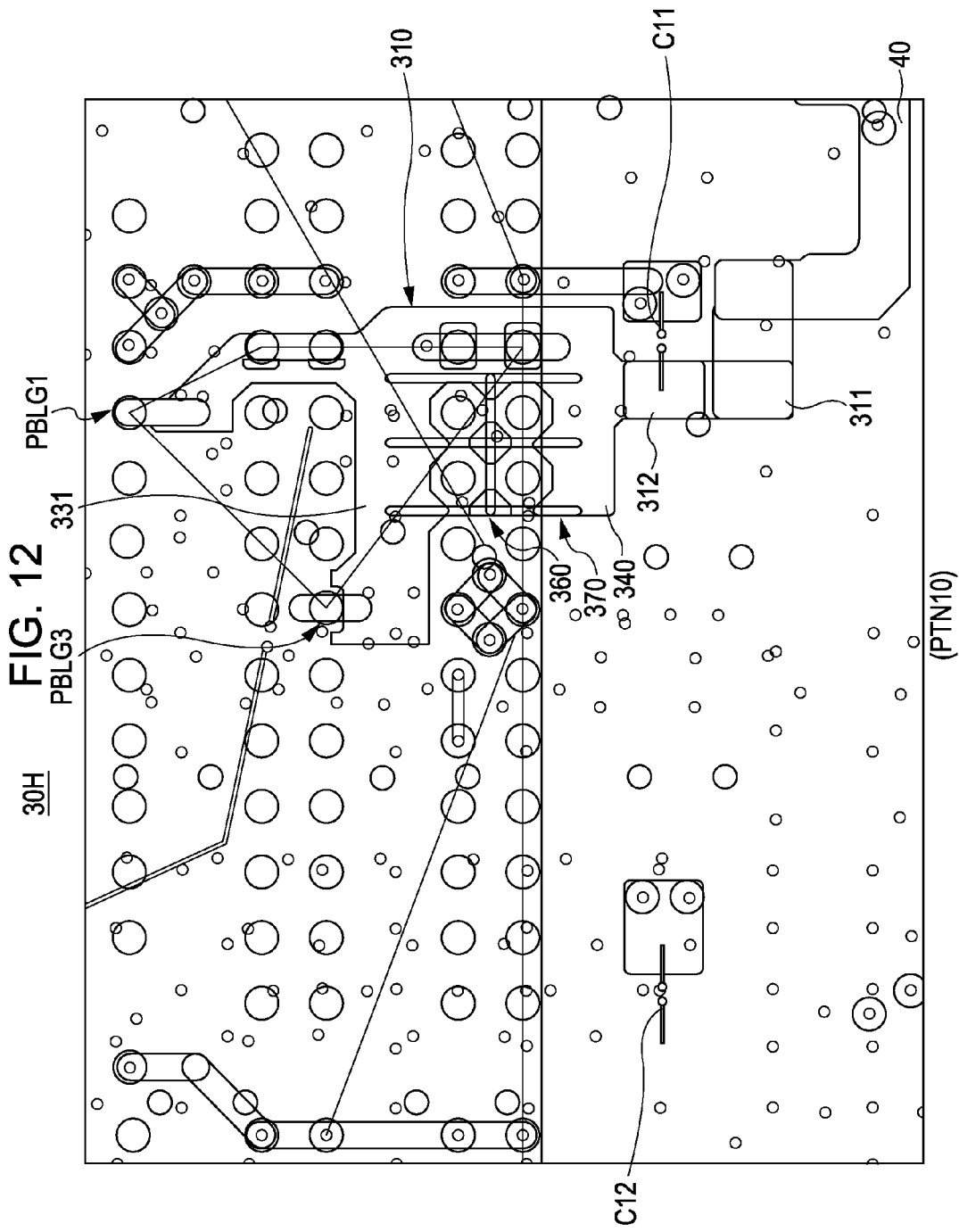
FIG. 12 illustrates a power supply wiring pattern area according to a ninth embodiment of the present invention.

FIG. 12 illustrates a power supply wiring pattern area according to a ninth embodiment of the present invention.

A power supply wiring pattern area 30H according to the present ninth embodiment only has the first power supply connection pattern 310, half of the first connection pattern 331, the first extended pattern 340, the spacing patterns 361 and 362, and the grid patterns 371 to 374 from the power supply wiring pattern area 30 in FIG. 3.

This power supply wiring pattern area 30H does not have the second power supply connection pattern 320, the second extended pattern 350, and the second connection pattern 332, and so it does not have the third connection portion 321 for the second bypass capacitor C12.

This pattern is defined as PTN10.

10. Tenth Embodiment

Figure 13:
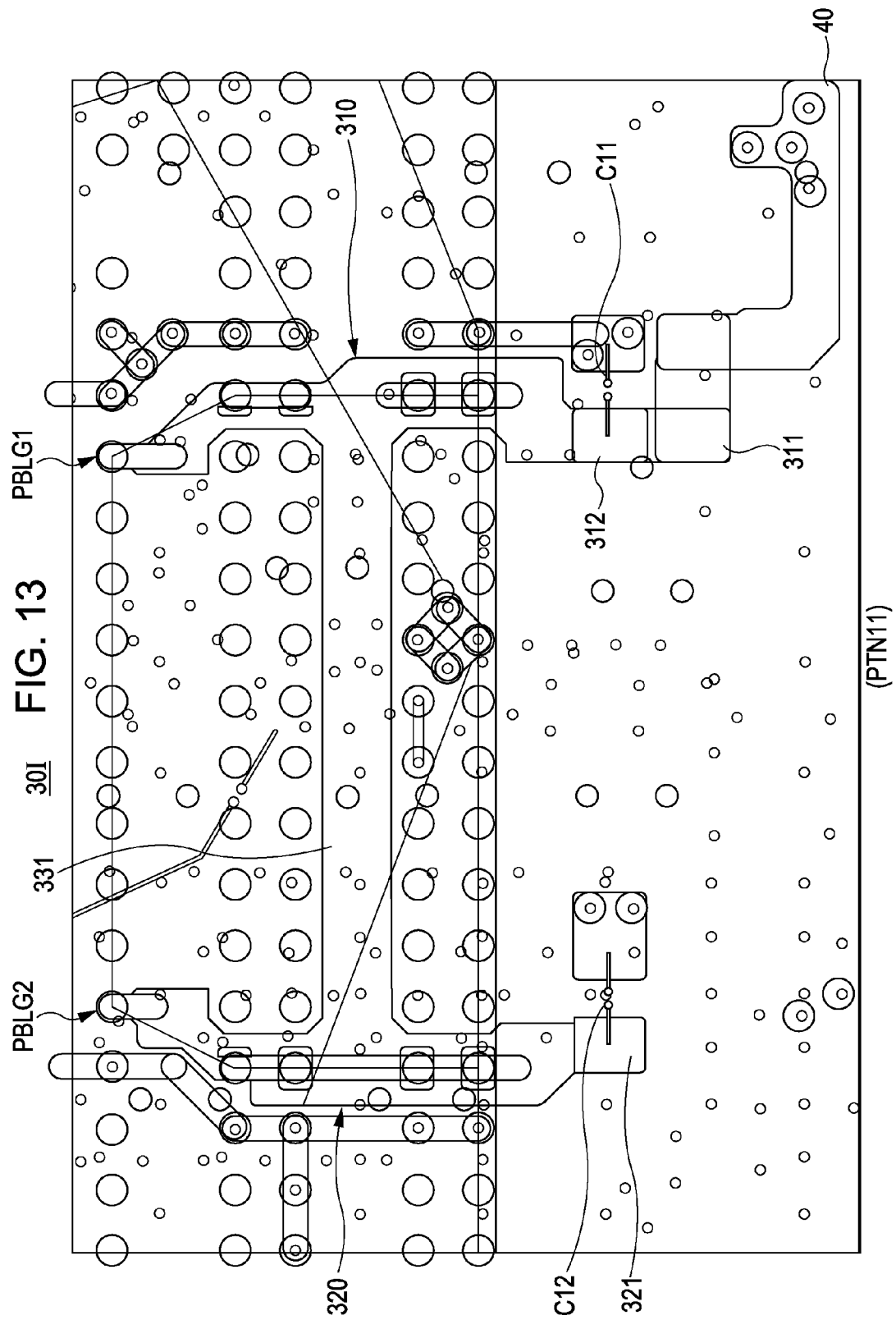
FIG. 13 illustrates a power supply wiring pattern area according to a tenth embodiment of the present invention.

FIG. 13 illustrates a power supply wiring pattern area according to a tenth embodiment of the present invention.

A power supply wiring pattern area 30I according to the present tenth embodiment has the first connection pattern 331 as the at least one connection pattern 330, and does not have the second connection pattern 332, the first extended pattern 340, and the second extended pattern 350.

Then, the first connection pattern 331 does not have the projection patterns 3312 to 33113 formed thereon, and has a configuration not in connection with the power supply ball PBL31 of the third power supply ball group PBLG3.

This pattern is defined as PTN11.

11. Eleventh Embodiment

Figure 14:
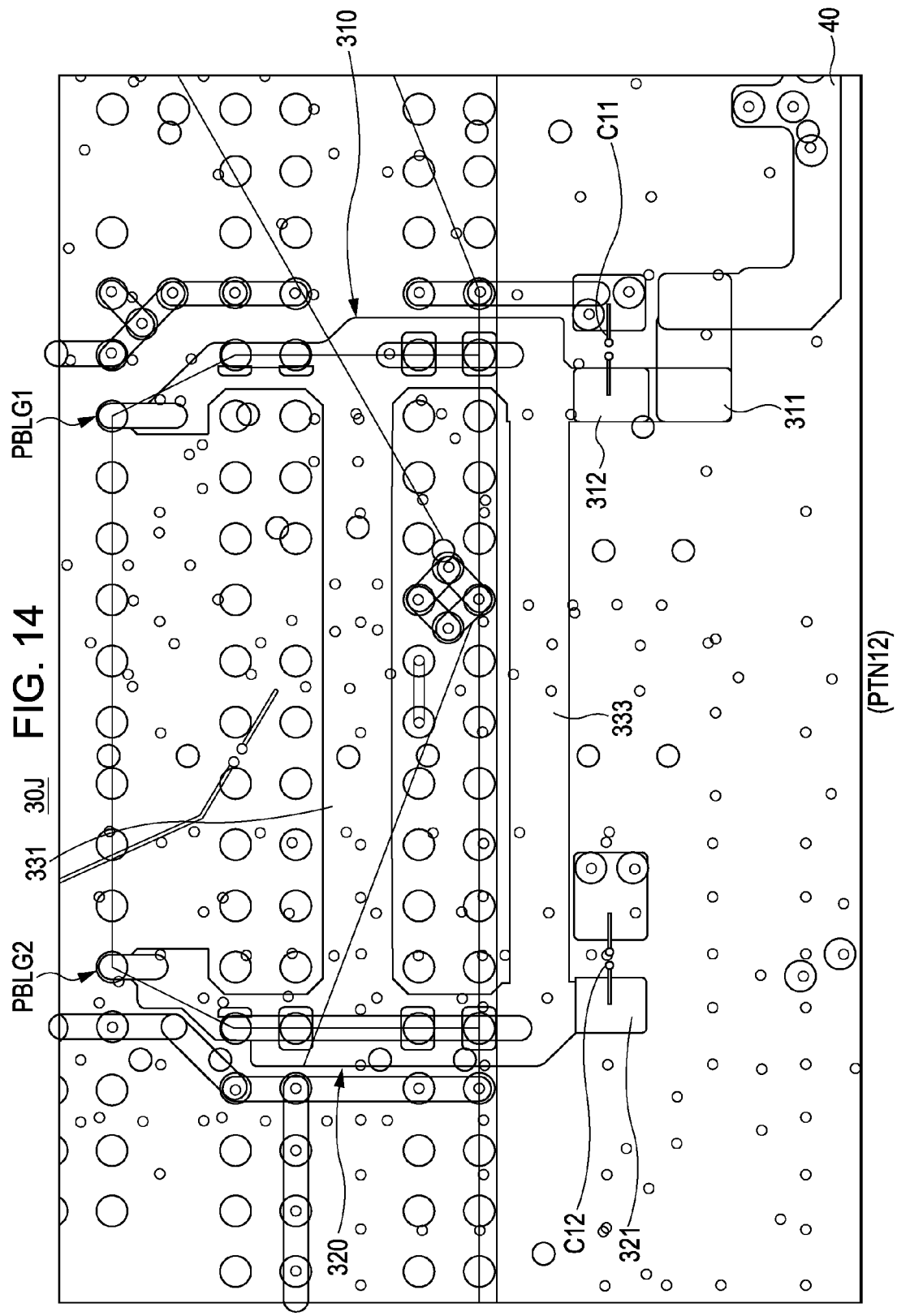
FIG. 14 illustrates a power supply wiring pattern area according to an eleventh embodiment of the present invention.

FIG. 14 illustrates a power supply wiring pattern area according to an eleventh embodiment of the present invention.

A power supply wiring pattern area 30J according to the present eleventh embodiment, relative to the power supply wiring pattern area 30I in FIG. 13, connects the first extended pattern 340 and the second extended pattern 350 and has a third connection pattern 333 formed thereon, which does not have a projection pattern.

The third connection pattern 333 connects the one end portion 310a of the first power supply connection pattern 310 and the one end portion 320a of the second power supply connection pattern 320.

The third connection pattern 333 is formed in parallel with the first connection pattern 331.

The first connection pattern 331 and the third connection pattern 333 are effective to make the return path shortest.

This pattern is defined as PTN12.

12. Twelfth Embodiment

Figure 15:
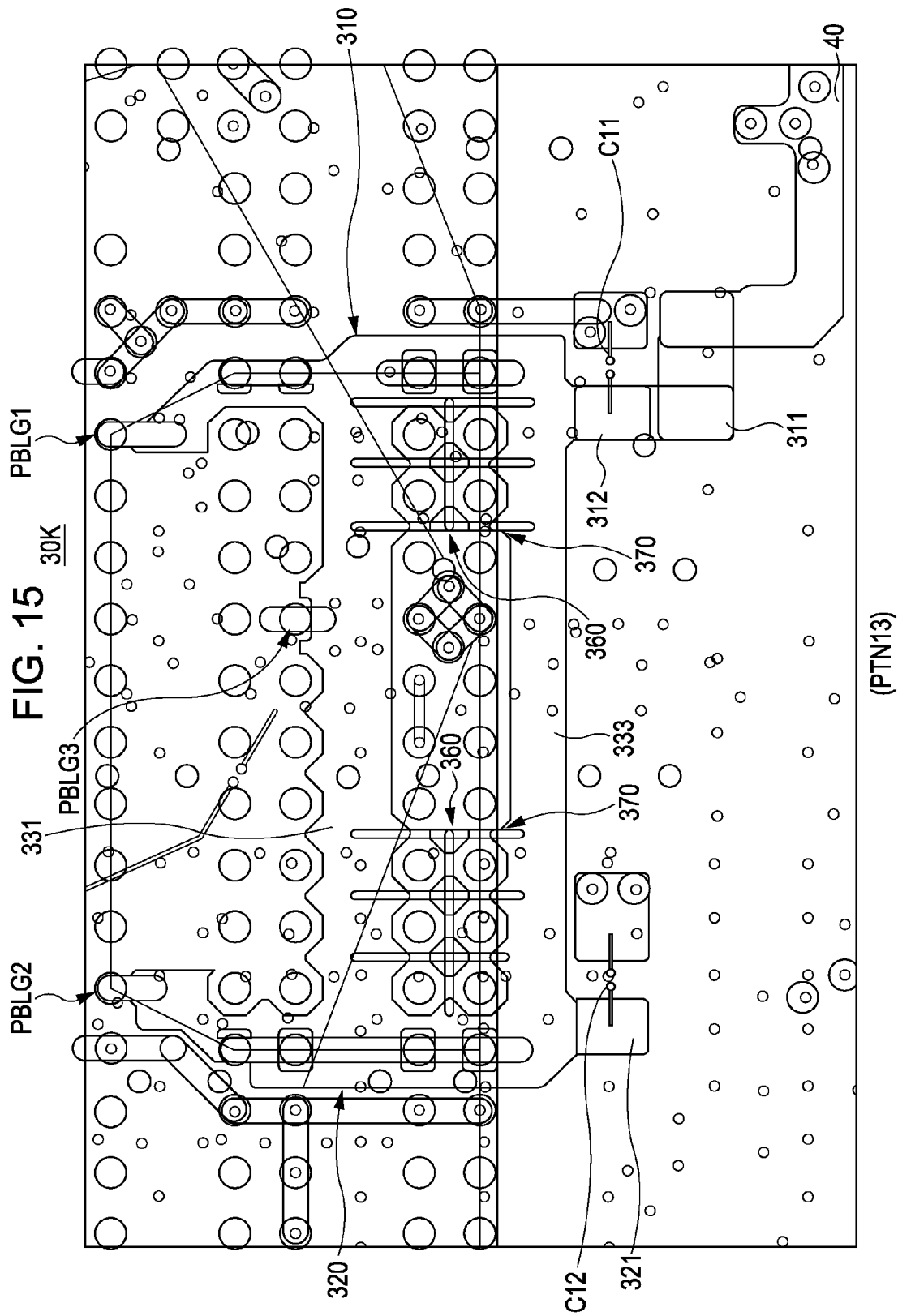
FIG. 15 illustrates a power supply wiring pattern area according to a twelfth embodiment of the present invention.

FIG. 15 illustrates a power supply wiring pattern area according to a twelfth embodiment of the present invention.

A power supply wiring pattern area 30K according to the present twelfth embodiment has a configuration, relative to the power supply wiring pattern area 30D in FIG. 7, in which the first extended pattern 340 and the second extended pattern 350 are connected.

This pattern is defined as PTN13.

13. Thirteenth Embodiment

Figure 16:
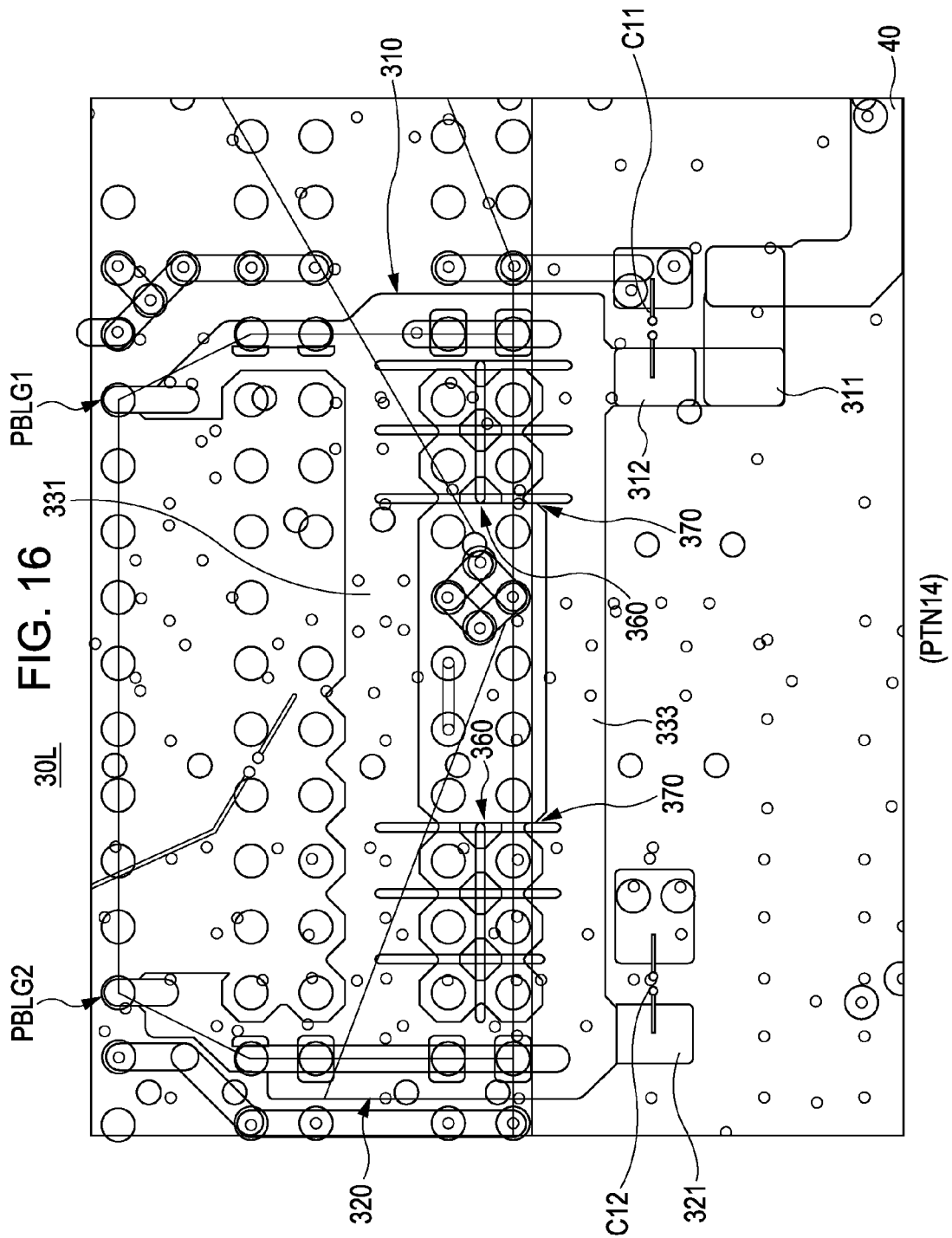
FIG. 16 illustrates a power supply wiring pattern area according to a thirteenth embodiment of the present invention.

FIG. 16 illustrates a power supply wiring pattern area according to a thirteenth embodiment of the present invention.

A power supply wiring pattern area 30L according to the present thirteenth embodiment has a configuration in which the connection with the power supply ball PBL31 of the third power supply ball group PBLG3 is eliminated from the power supply wiring pattern area 30K in FIG. 15.

This pattern is defined as PTN14.

14. Fourteenth Embodiment

Figure 17:
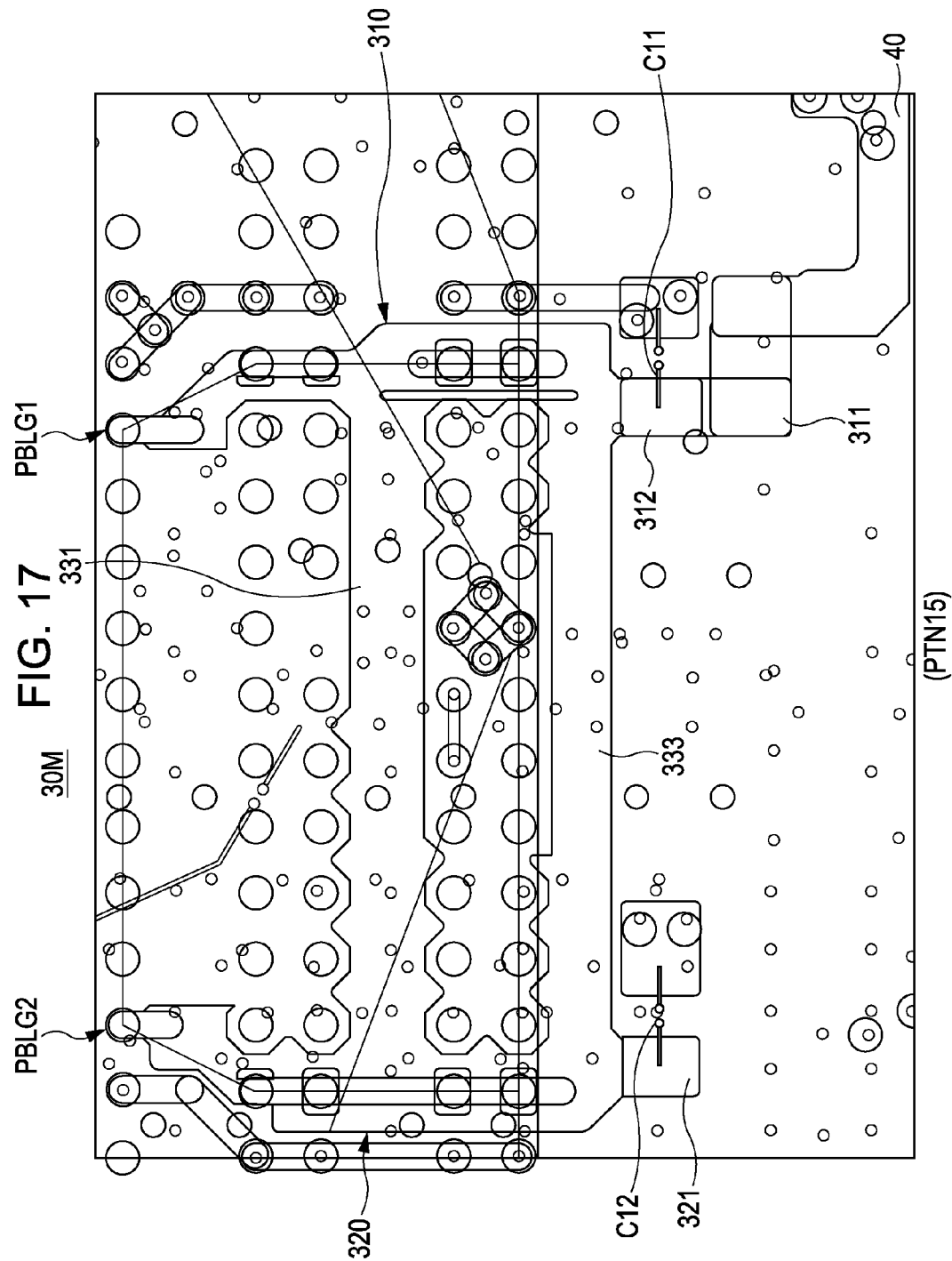
FIG. 17 illustrates a power supply wiring pattern area according to a fourteenth embodiment of the present invention.

FIG. 17 illustrates a power supply wiring pattern area according to a fourteenth embodiment of the present invention.

A power supply wiring pattern area 30M according to the present fourteenth embodiment has a configuration in which the spacing patterns 360 and the grid patterns 370 are eliminated from the power supply wiring pattern area 30L in FIG. 16.

This pattern is defined as PTN15.

15. Fifteenth Embodiment

Figure 18:
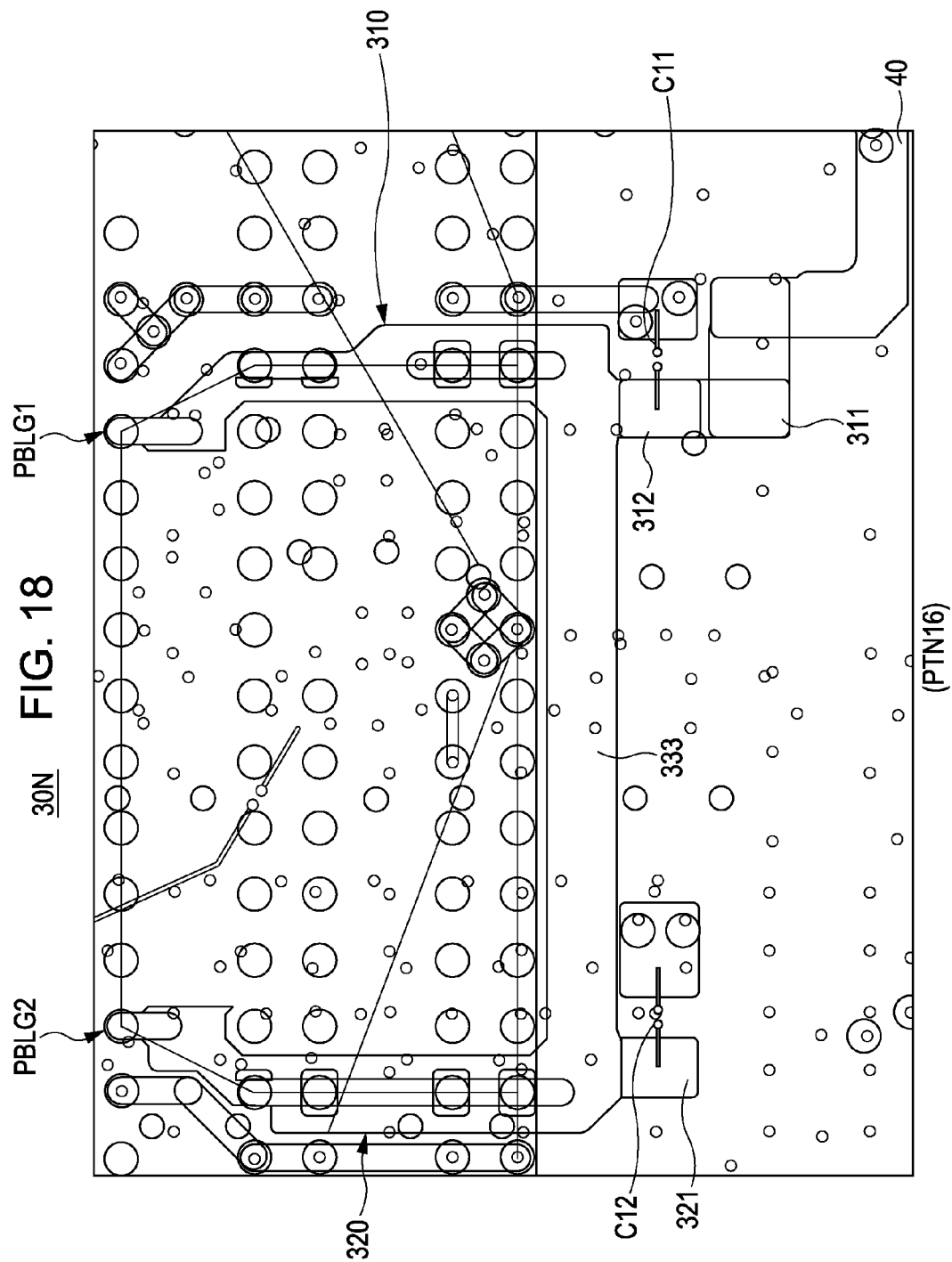
FIG. 18 illustrates a power supply wiring pattern area according to a fifteenth embodiment of the present invention.

FIG. 18 illustrates a power supply wiring pattern area according to a fifteenth embodiment of the present invention.

A power supply wiring pattern area 30N according to the present fifteenth embodiment has a configuration in which the first connection pattern 331 is eliminated from the power supply wiring pattern area 30J in FIG. 14. This pattern is defined as PTN16.

16. Sixteenth Embodiment

Figure 19:
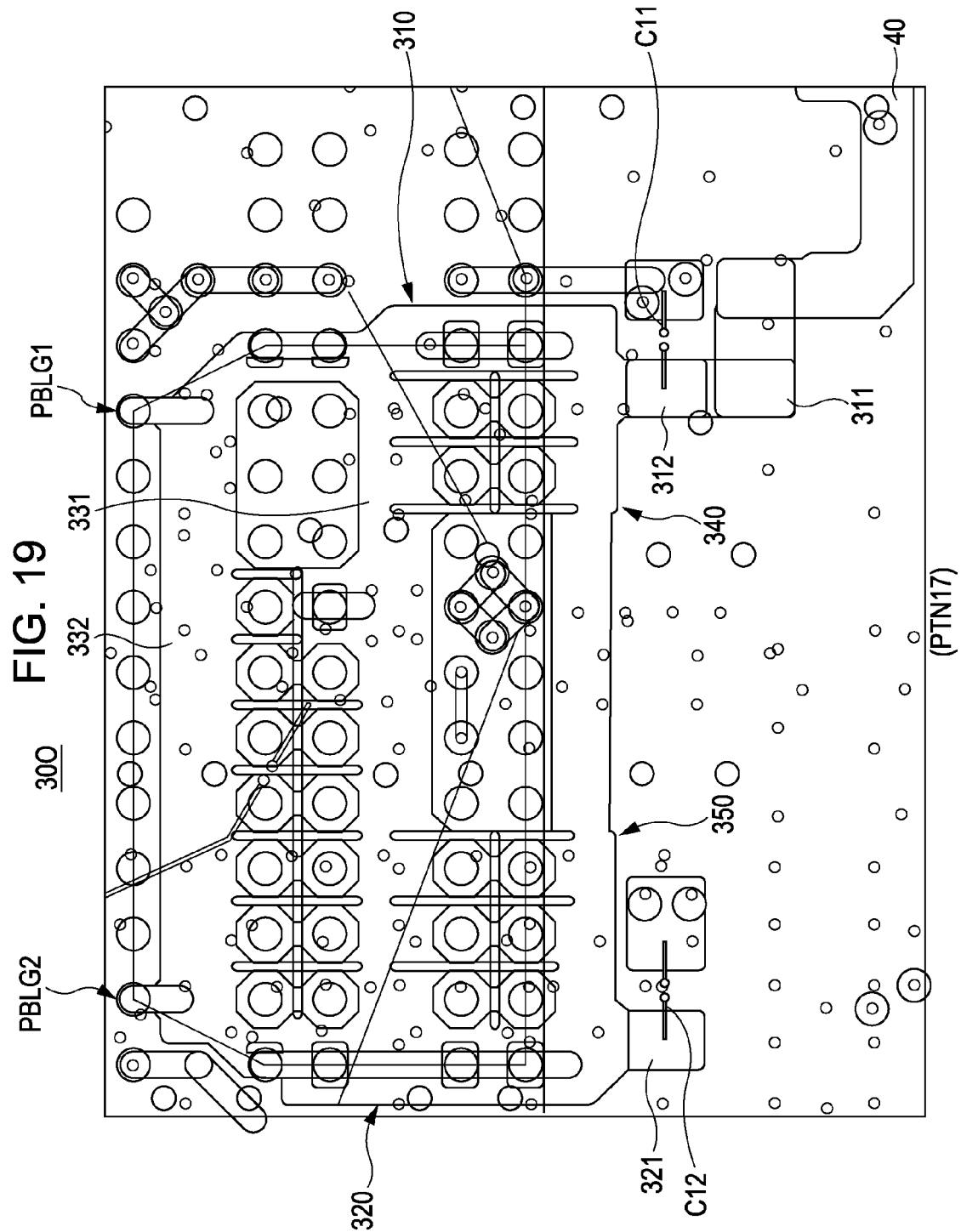
FIG. 19 illustrates a power supply wiring pattern area according to a sixteenth embodiment of the present invention.

FIG. 19 illustrates a power supply wiring pattern area according to a sixteenth embodiment of the present invention.

A power supply wiring pattern area 30O according to the present sixteenth embodiment has a configuration, relative to the power supply wiring pattern area 30 in FIG. 3, in which the first extended pattern 340 and the second extended pattern 350 are connected.

This pattern is defined as PTN17.

17. Comparative Example

Figure 20:
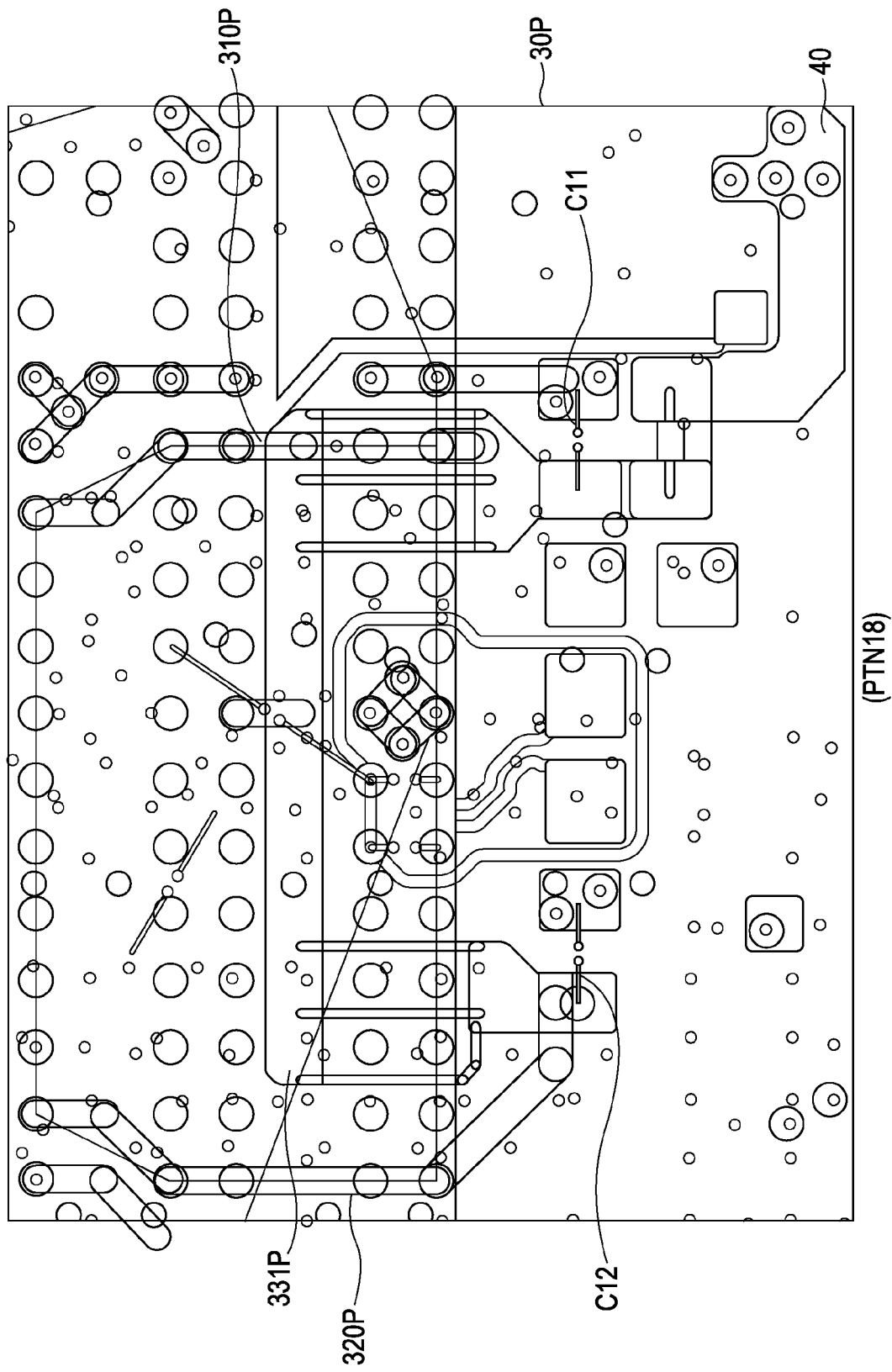
FIG. 20 illustrates a power supply wiring pattern area as a comparative example relative to the power supply wiring pattern areas according to the first to sixteenth embodiments of the present invention.

FIG. 20 illustrates a power supply wiring pattern area as a comparative example relative to the power supply wiring pattern areas according to the first to sixteenth embodiments of the present invention.

A power supply wiring pattern area 30P in FIG. 20 has a second power supply connection pattern 320P not in connection with a first connection pattern 331P and in connection with the third connection portion 321 by another path.

The first and second power supply connection patterns 310P and 320P have the width only for the connection with the power supply balls PBL.

One end portion of the first connection pattern 331P is connected to the first connection portion 311 and the second connection portion 312 only by thin grid patterns.

Similarly, the other end portion of the first connection pattern 331P is connected to the third connection portion 321 only by thin grid patterns.

The power supply wiring pattern area 30P in FIG. 20 does not have the second connection pattern 332, the first extended pattern 340, the second extended pattern 350, and the third connection pattern 333 according to the embodiments.

This pattern is defined as PTN18.

The patterns PTN1 to PTN17 related to the power supply wiring pattern areas 30 and 30A to 30O according to the above first to sixteenth embodiments and the pattern PTN18 of the power supply wiring pattern area 30P, as the comparative example, are subjected to the following simulations.

In the board layouts illustrated in FIGS. 3 to 20, the simulations are carried out for 32-bit SSO jitter in the mDDR memory interface area mounted on the mobile application product motherboard of FIG. 2 as a layer configuration.

That is, in each of the board layout power supply patterns illustrated in FIGS. 3 to 20, an S parameter is extracted by an electromagnetic field analysis tool and the patterns are mounted on mobile application product motherboards as the board in FIG. 2.

Figure 21:
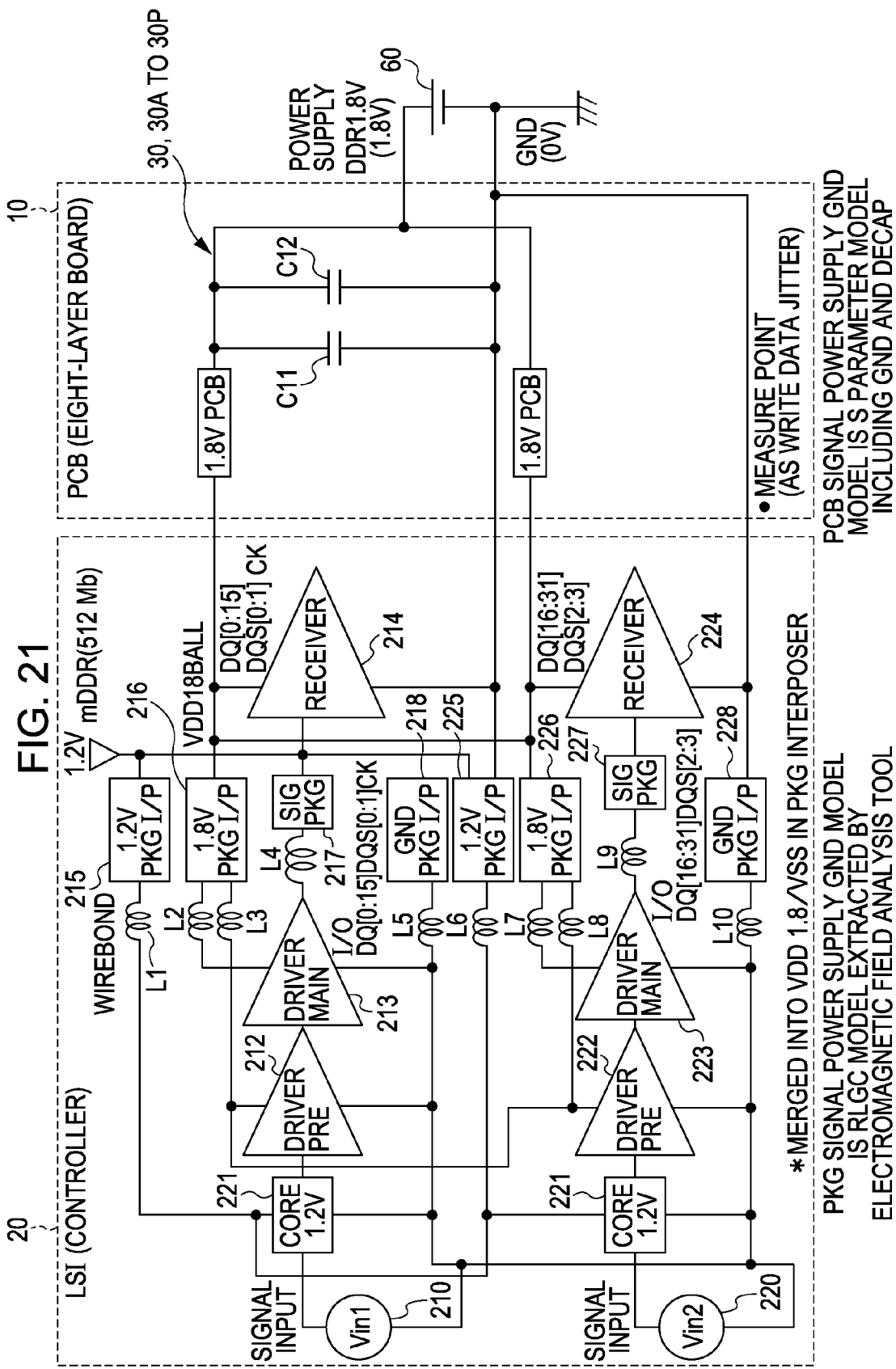
FIG. 21 illustrates an equivalent circuit used in an SSO jitter analysis.

In the present embodiments, a circuit simulation analysis is carried out, using HSPICE, in a simultaneous switching state of an mDDR memory interface area in a circuit network illustrated in FIG. 21 as the LSI 20.

FIG. 21 illustrates an equivalent circuit used in an SSO jitter analysis at this time.

The LSI 20 in FIG. 21 has a first signal input unit 210 and a second signal input unit 220.

For the first signal input unit 210, it has a core unit 211, a predriver 212, a main driver 213, a receiver 214, a 1.2 V package 215, a 1.8 V package 216, a signal package 217, and a ground package 218.

For the second signal input unit 220, it has a core unit 221, a predriver 222, a main driver 223, a receiver 224, a 1.2 V package 225, a 1.8 V package 226, a signal package 227, and a ground package 228.

In FIG. 21, L1 to L10 denote inductors.

In FIG. 21, a reference numeral 60 denotes a power supply as a DC-DC converter.

By using random pulses for I/O input signals of the LSI (memory controller) 20, same random signals are supplied to DQ 32-bit and the pulses are inputted to DQS 44-bit 90 degrees in delay.

A supply point of a power supply GND supplies ideal power supply 1.8 V from the position of the DC-DC converter.

For the bypass capacitor model on board, an equivalent circuit model of a common product of 0.1 µF is used.

For the power supply GND and signals of the LSI package, SPICE models extracted by the electromagnetic field analysis tool are used.

For the signals and the power supply GND of the board, SPICE models extracted by the electromagnetic field analysis tool are used.

For the transmitting LSI I/O, SPICE models (drive strength: quarter) including the predriver is used, and IBIS models are used for the receiving mobile DDR (mDDR).

Waveform measurement is observed at a ball end on the DDR side.

Figure 22:
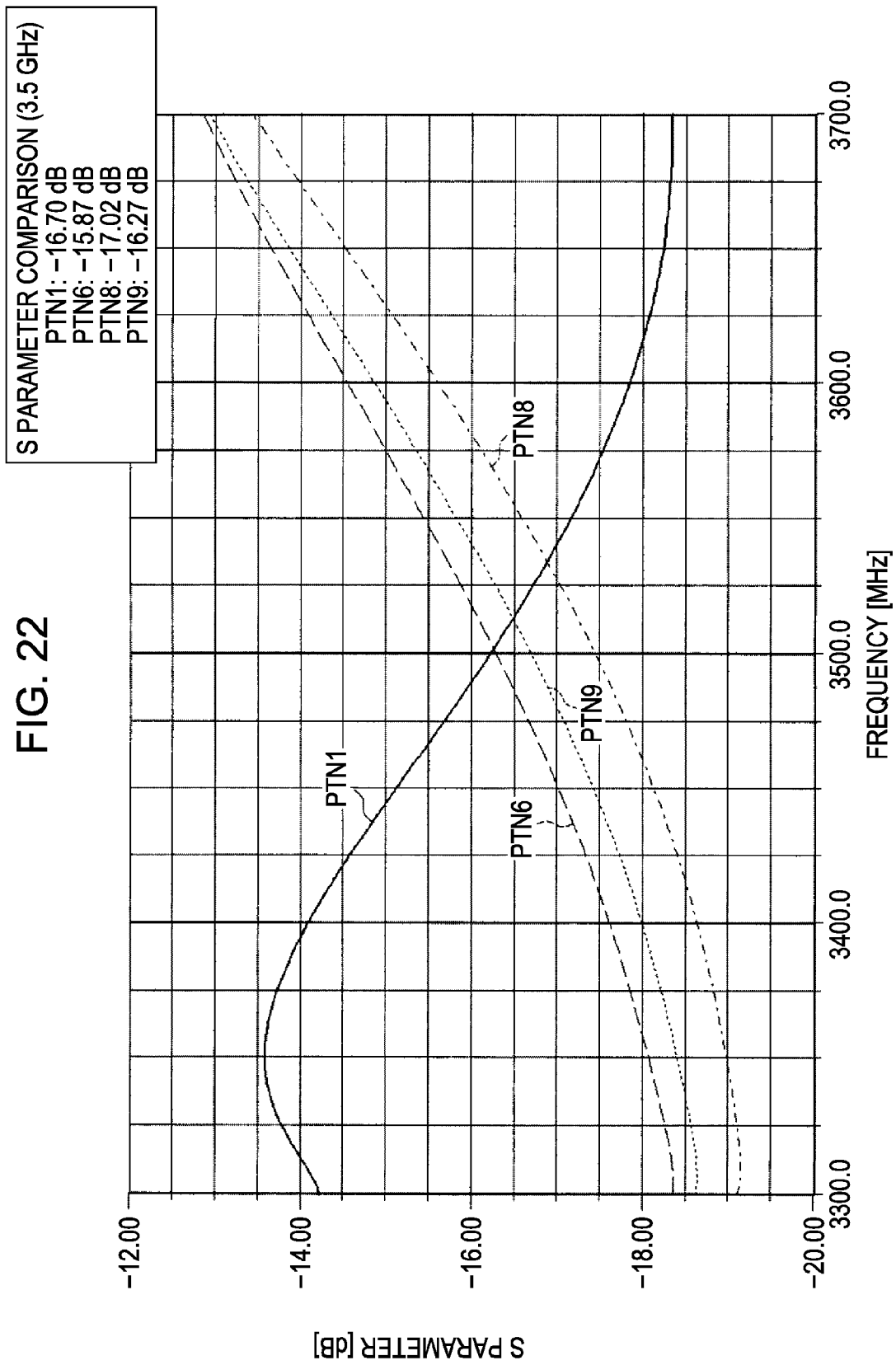
FIG. 22 illustrates S parameter characteristics of patterns PTN1, PTN6, PTN8, and PTN9 of the embodiments.

FIG. 22 illustrates S parameter characteristics of the patterns PTN1, PTN6, PTN8, and PTN9 of the embodiments.

Figure 23:
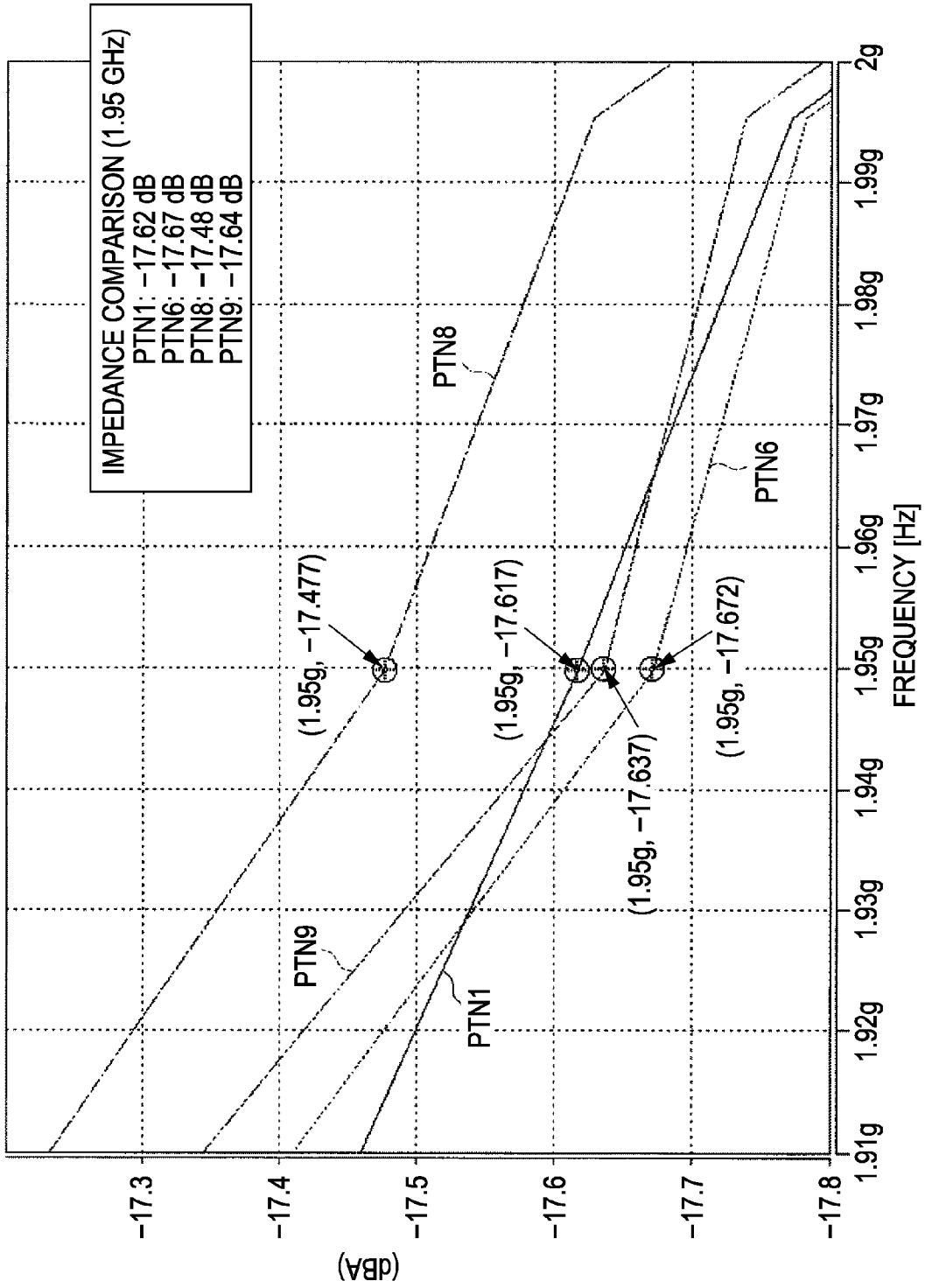
FIG. 23 illustrates, by comparison, impedance characteristics in a predetermined range of patterns PTN1, PTN6, PTN8, and PTN9 of the embodiments.

FIG. 23 illustrates, by comparison, impedance characteristics in a predetermined range of the patterns PTN1, PTN6, PTN8, and PTN9 of the embodiments.

Figure 24:
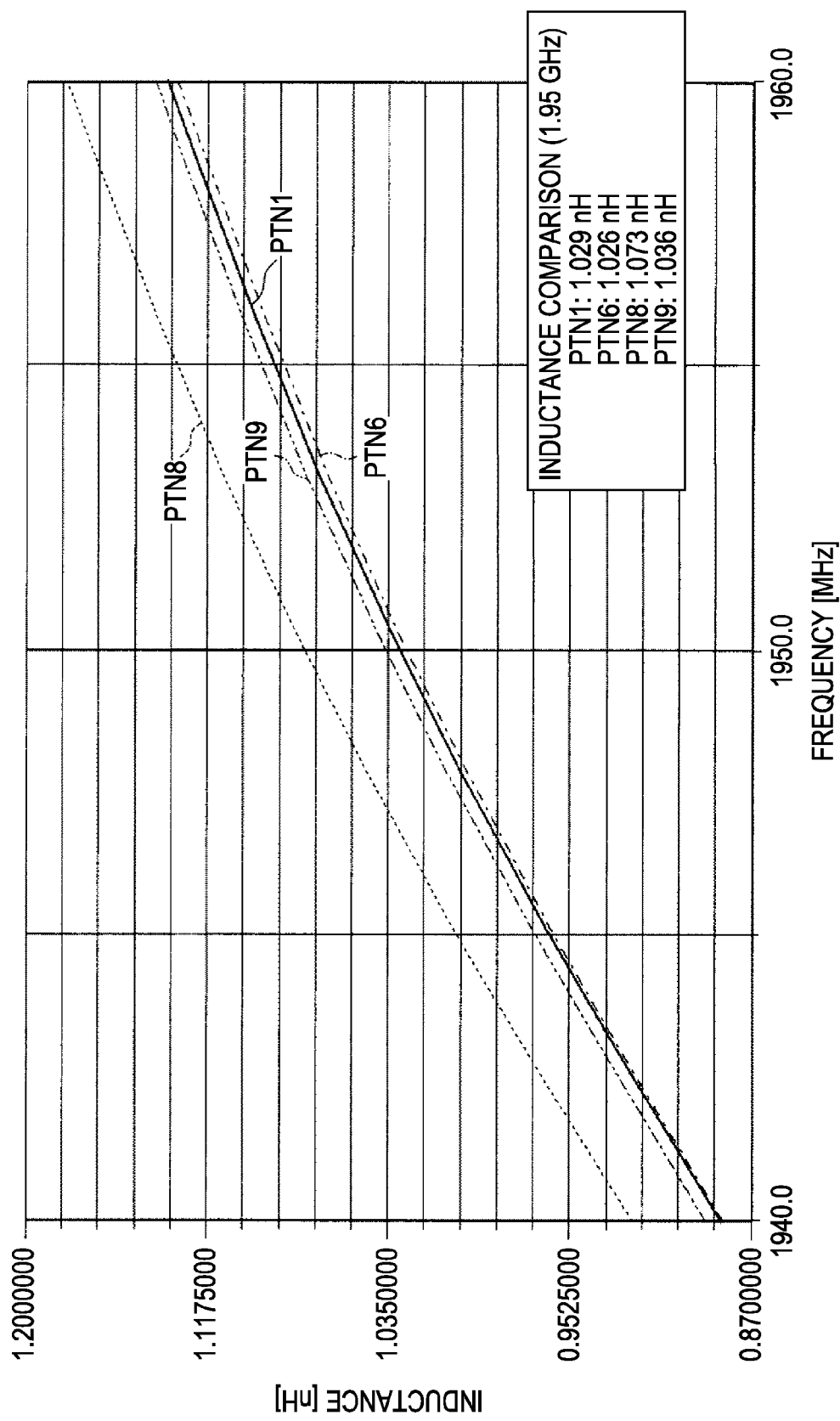
FIG. 24 illustrates, by comparison, inductance characteristics in a predetermined range of patterns PTN1, PTN6, PTN8, and PTN9 of the embodiments.

FIG. 24 illustrates, by comparison, inductance characteristics in a predetermined range of the patterns PTN1, PTN6, PTN8, and PTN9 of the embodiments.

Figure 25:
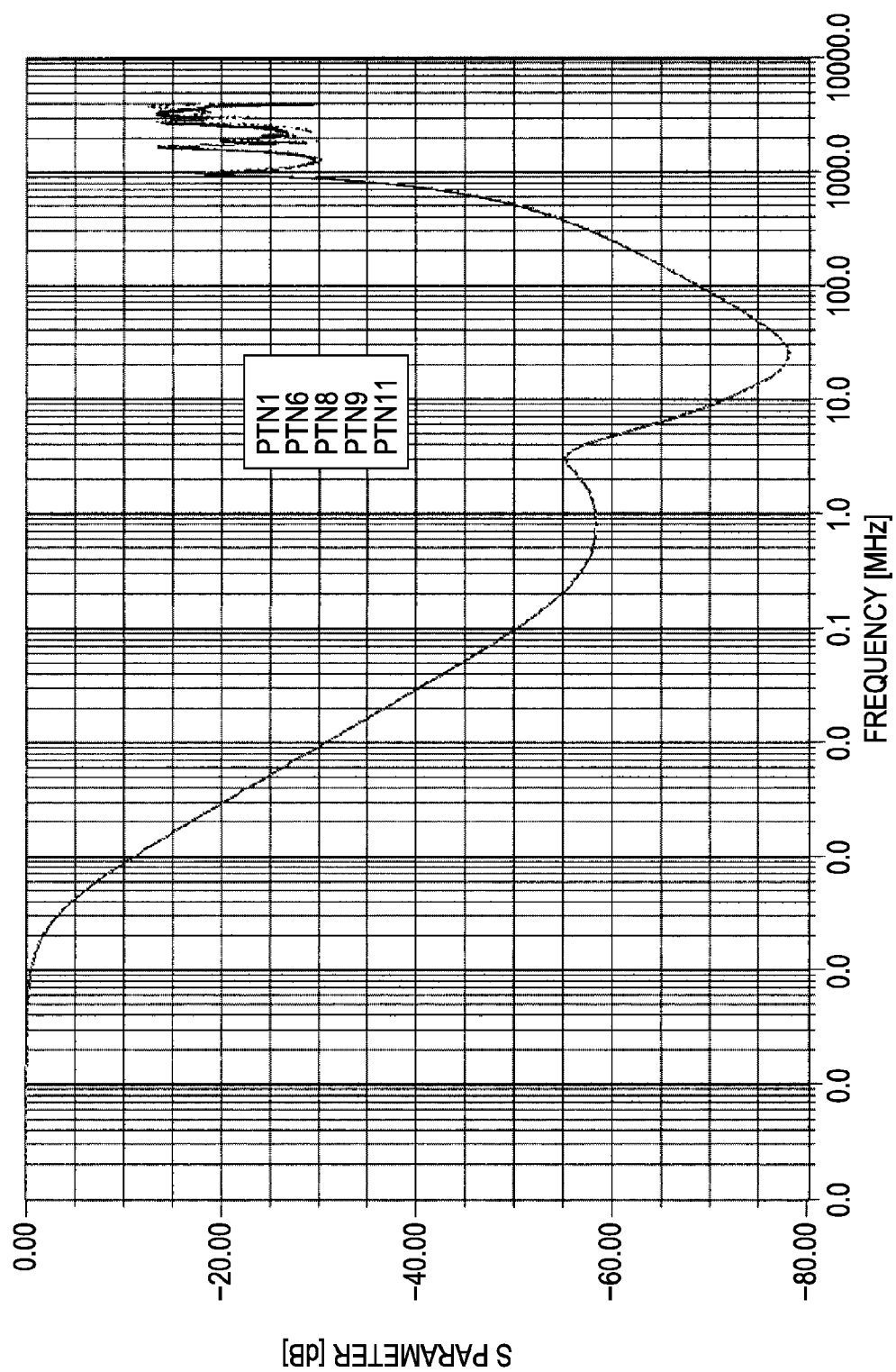
FIG. 25 illustrates S parameter characteristics of patterns PTN1, PTN6, PTN8, PTN9, and PTN11 of the embodiments.

FIG. 25 illustrates S parameter characteristics of the patterns PTN1, PTN6, PTN8, PTN9, and PTN11 of the embodiments.

Figure 26:
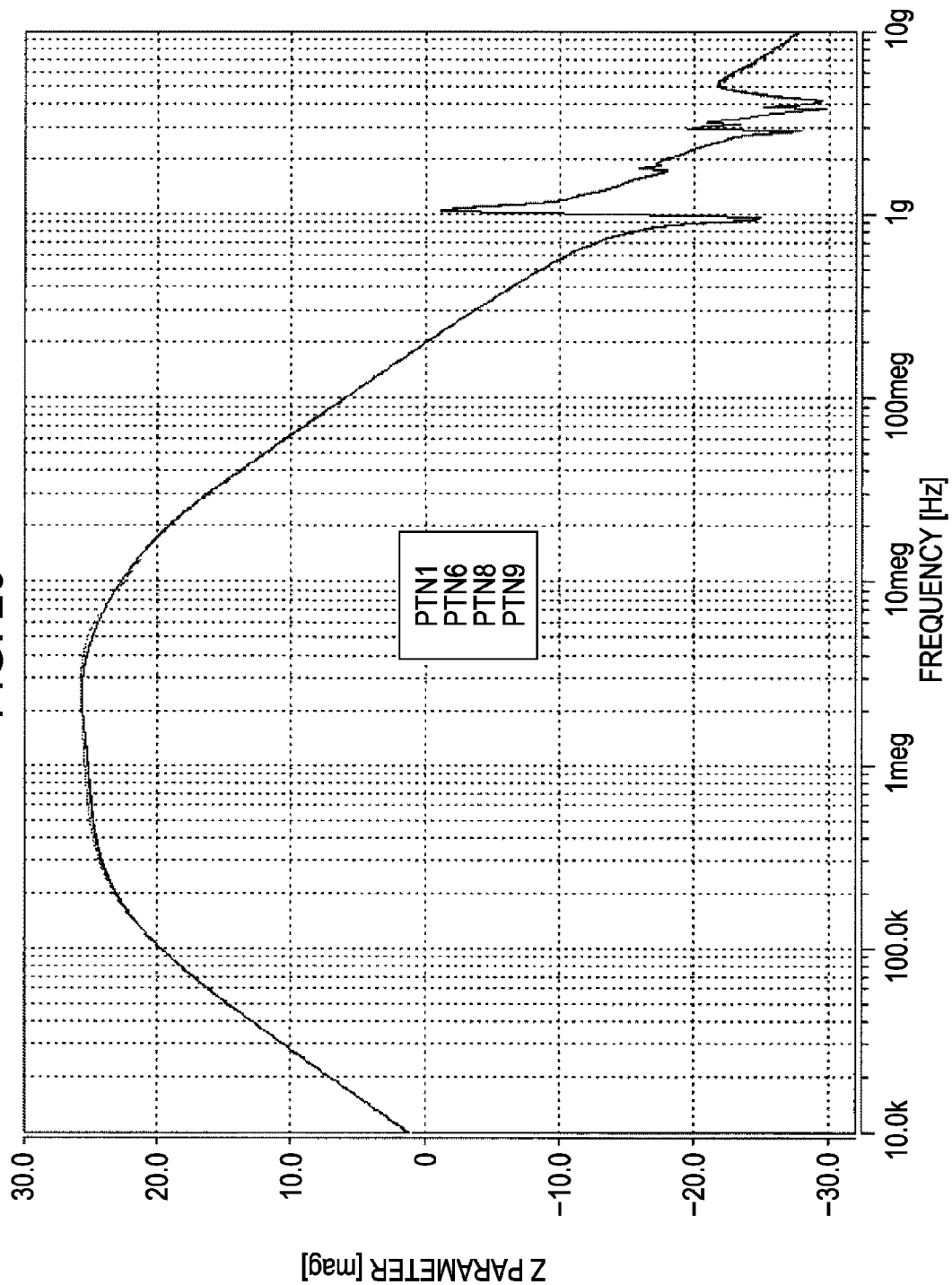
FIG. 26 illustrates, by comparison, impedance characteristics of patterns PTN1, PTN6, PTN8, and PTN9 of the embodiments.

FIG. 26 illustrates, by comparison, impedance characteristics of the patterns PTN1, PTN6, PTN8, and PTN9 of the embodiments.

Figure 27:
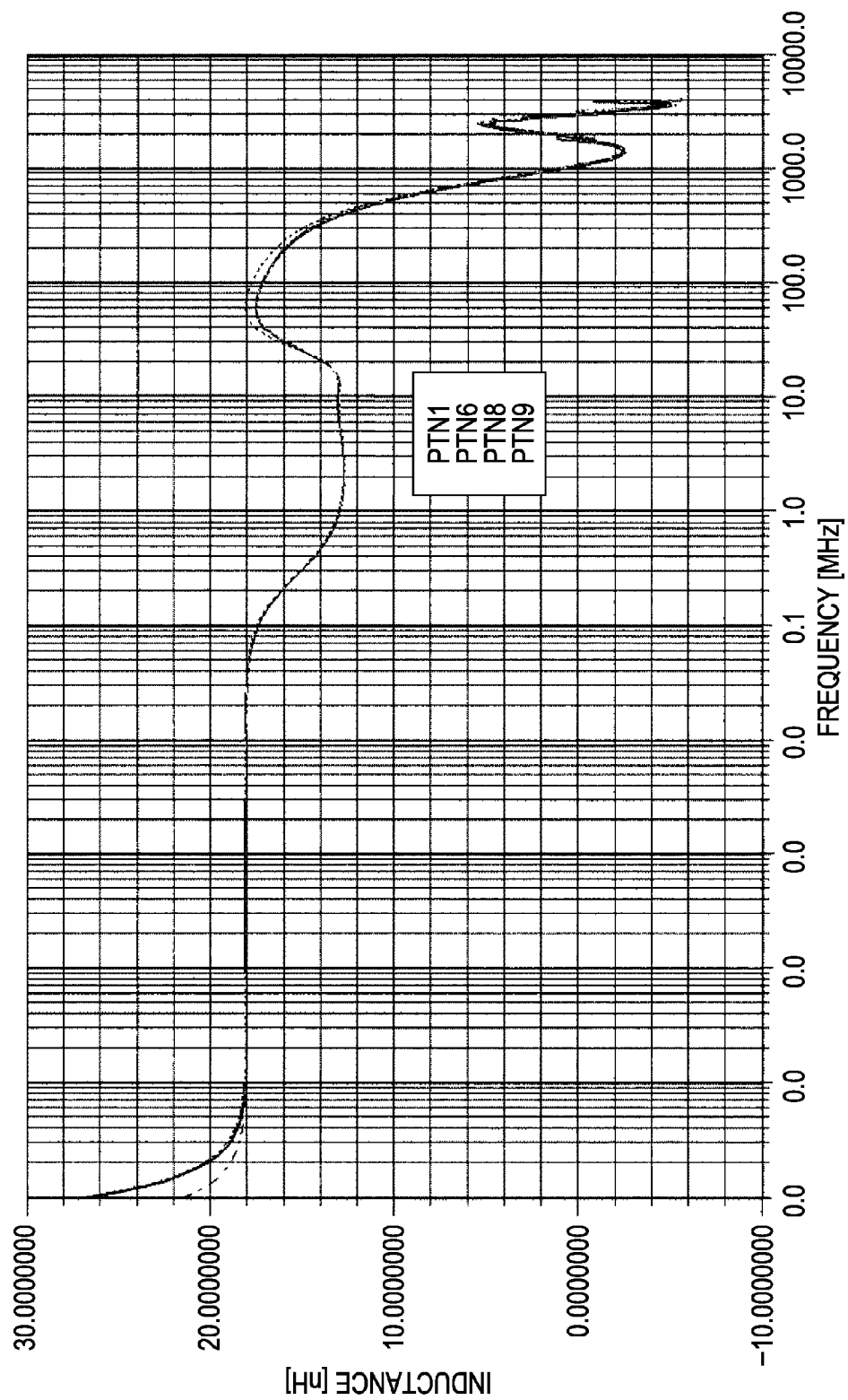
FIG. 27 illustrates, by comparison, inductance characteristics of patterns PTN1, PTN6, PTN8, and PTN9 of the embodiments.

FIG. 27 illustrates, by comparison, inductance characteristics of the patterns PTN1, PTN6, PTN8, and PTN9 of the embodiments.

Figure 28:
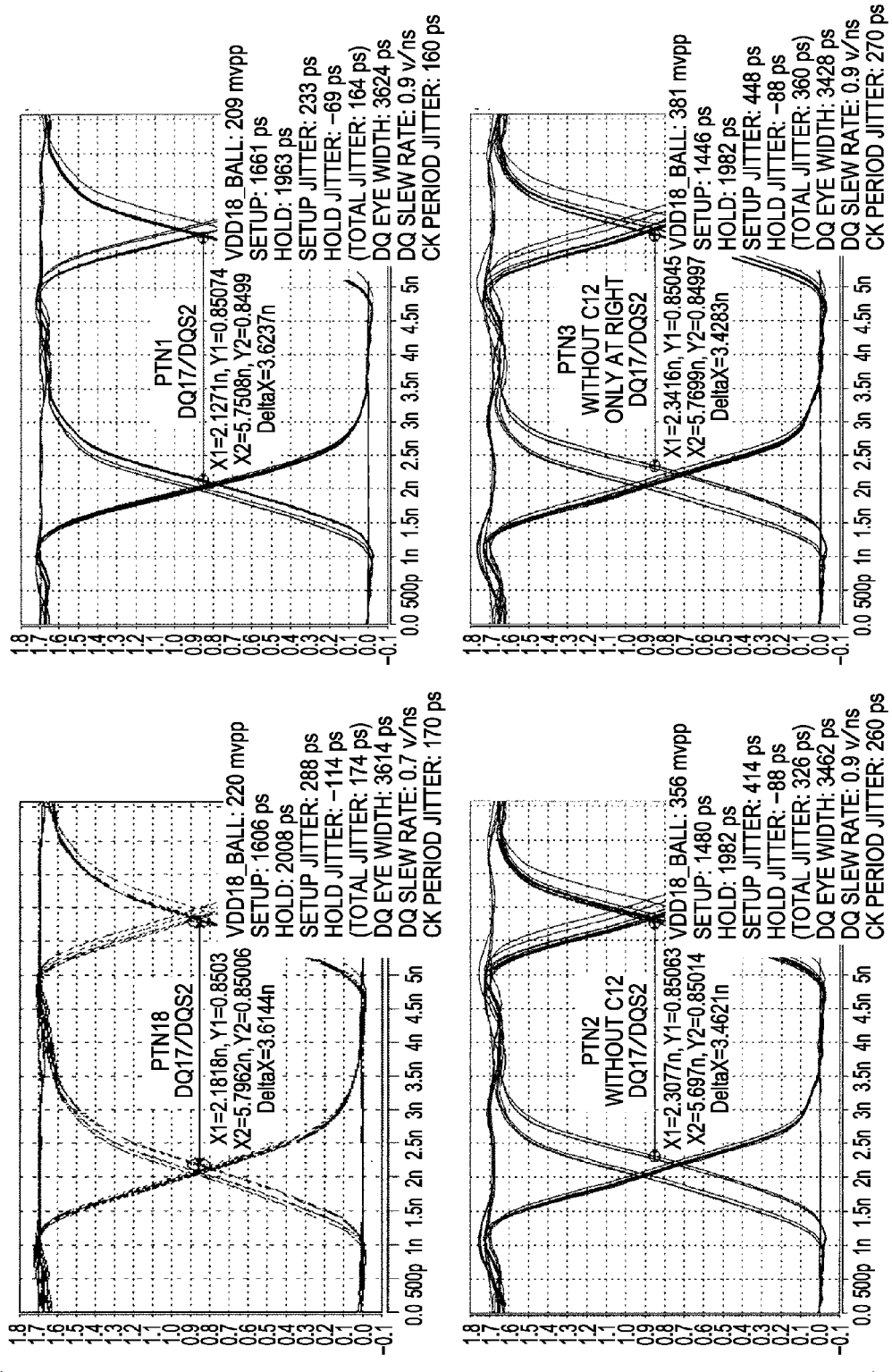
FIG. 28 illustrates SSO jitter analysis results of patterns PTN1, PTN2, and PTN3 of the embodiments and a comparative pattern PTN18.

FIG. 28 illustrates SSO jitter analysis results of the patterns PTN1, PTN2, and PTN3 of the embodiments and the comparative pattern PTN18.

Figure 29:
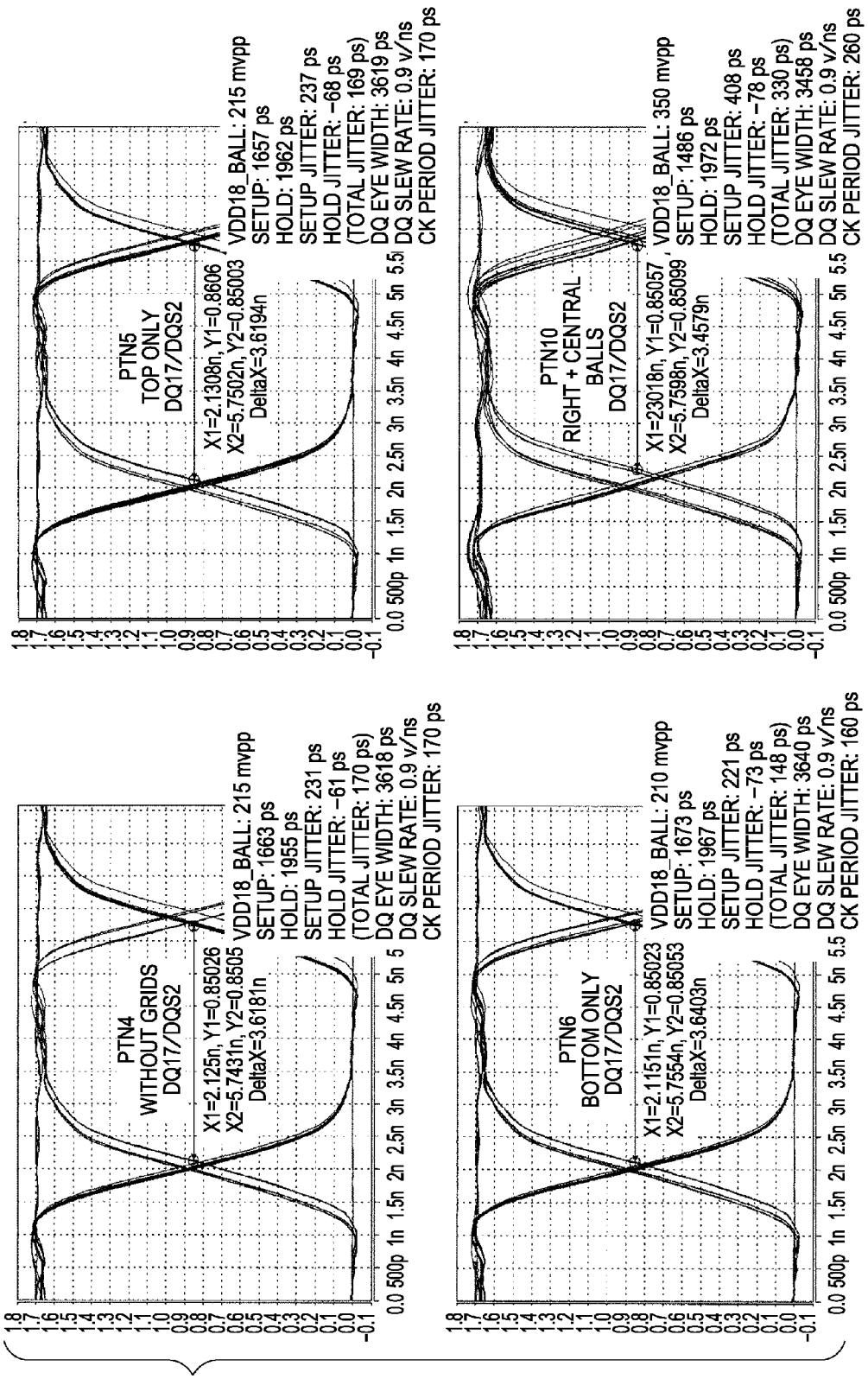
FIG. 29 illustrates SSO jitter analysis results of patterns PTN4, PINS, PTN6, and PTN10 of the embodiments.

FIG. 29 illustrates SSO jitter analysis results of the patterns PTN4, PINS, PTN6, and PTN10 of the embodiments.

Figure 30:
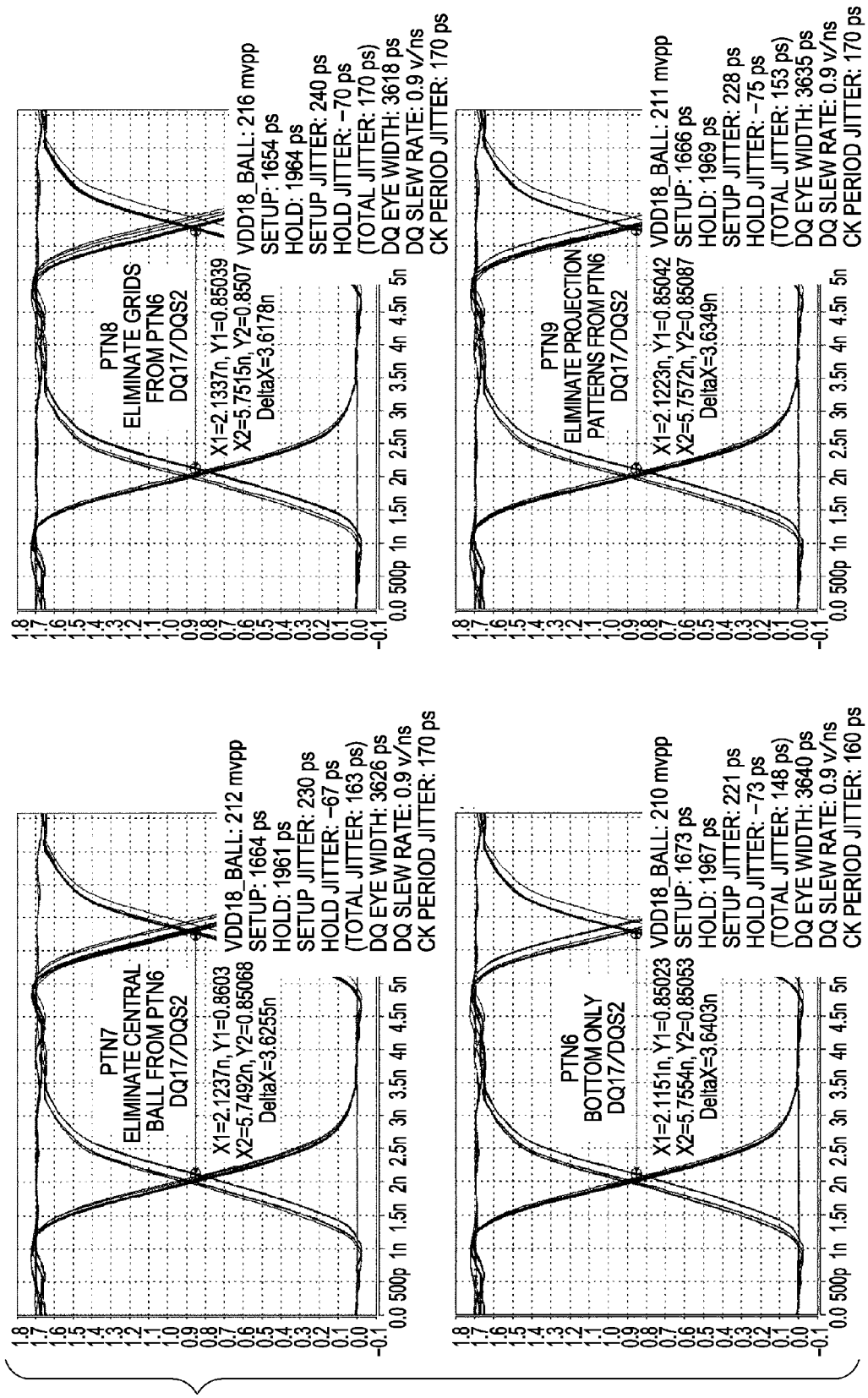
FIG. 30 illustrates SSO jitter analysis results of patterns PTN7, PTN8, PTN6, and PTN9 of the embodiments.

FIG. 30 illustrates SSO jitter analysis results of the patterns PTN7, PTN8, PTN6, and PTN9 of the embodiments.

Figure 31:
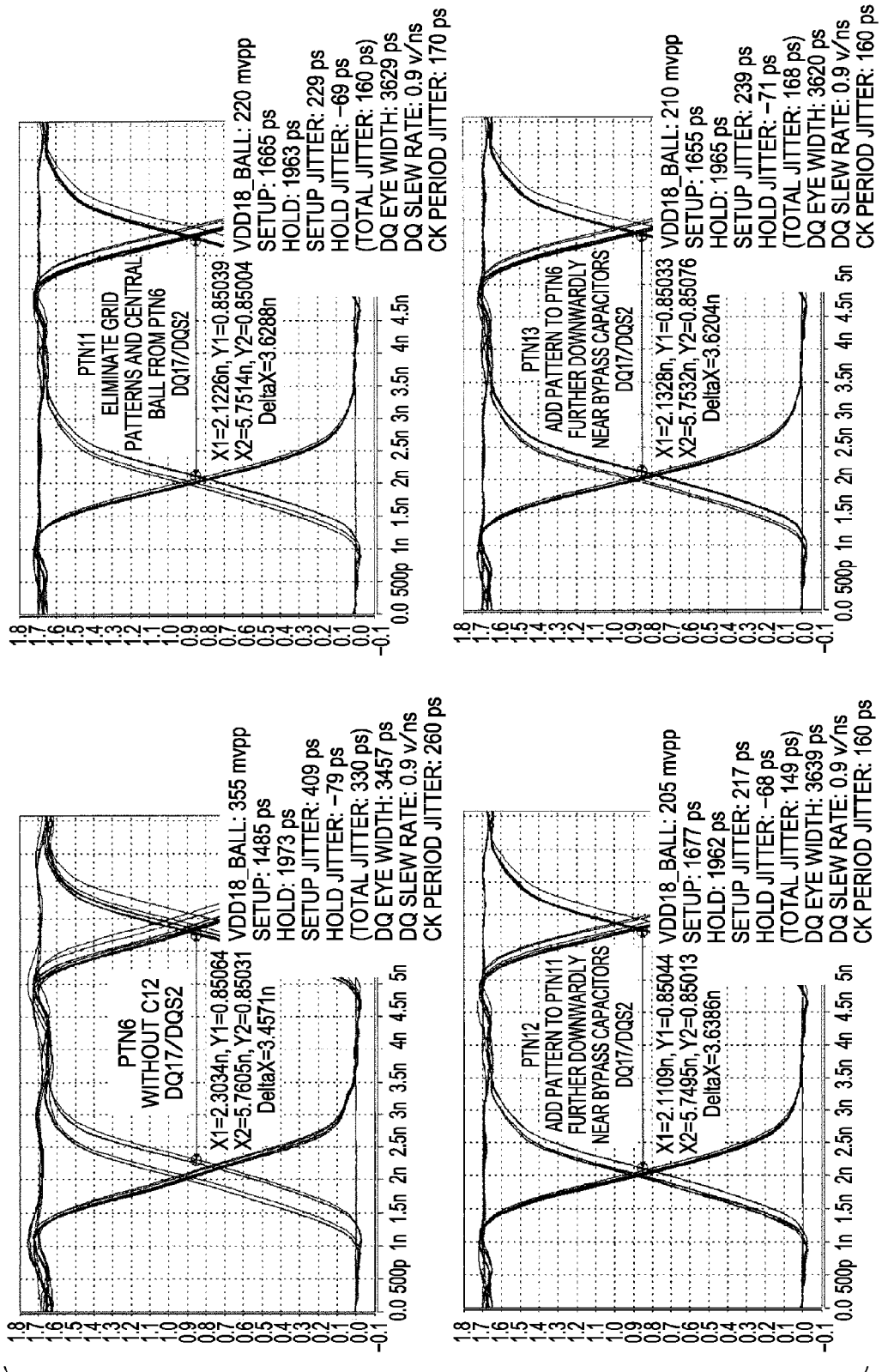
FIG. 31 illustrates SSO jitter analysis results of patterns PTN6, PTN11, PTN12, and PTN13 of the embodiments.

FIG. 31 illustrates SSO jitter analysis results of the patterns PTN6, PTN11, PTN12, and PTN13 of the embodiments.

Figure 32:
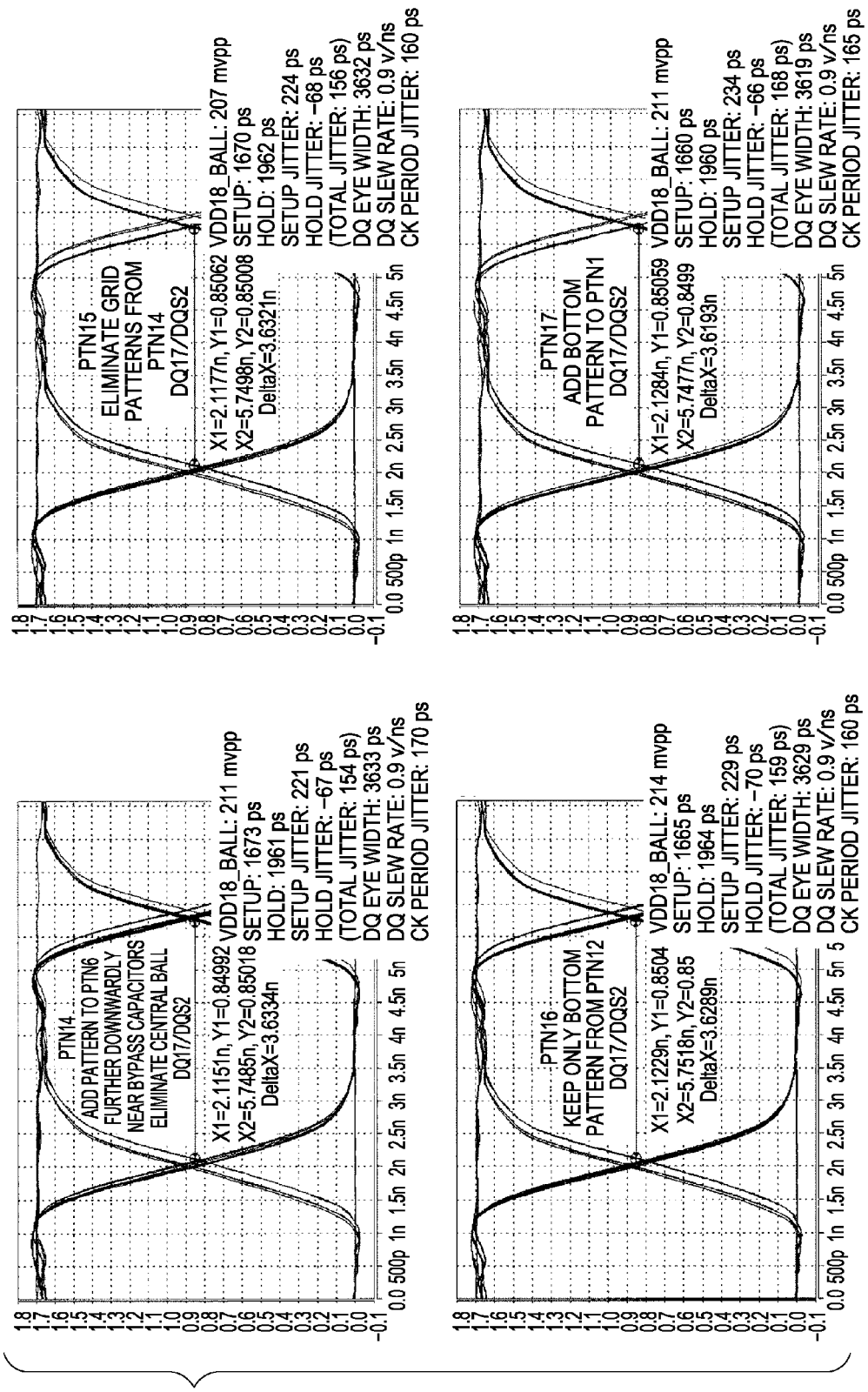
FIG. 32 illustrates SSO jitter analysis results of patterns PTN14, PTN15, PTN16, and PTN17 of the embodiments.

FIG. 32 illustrates SSO jitter analysis results of the patterns PTN14, PTN15, PTN16, and PTN17 of the embodiments.

FIG. 33 illustrates evaluation results of SSO and clock jitter in simulations.

In the present embodiments, to power supply wiring immediately below an LSI as in the pattern PTN18, wiring is added in a grid with a clearance of 75 μm between the balls as in the pattern PTN1 to secure a more area for power supply, and thus the wiring is enhanced and the effect of the bypass capacitor C12 is also enhanced.

The analysis results in FIGS. 28 to 32 have so-called eye patterns of DQ17 when DQS triggered.

In these examples, from read values of a setup time and a hold time of DQ17, the setup time and the hold jitter of a value that is subtracted from 1894 ps (half period 3788 ps) are compared in various patterns.

For example, it is found that the setup jitter in the pattern PTN1 is improved by approximately 60 ps compared to the pattern PTN18.

FIG. 33 shows comparison of jitter when modifying the power supply pattern form relative to the original pattern form of the pattern PTN1 according to the analysis results.

In the present embodiments, when comparing the setup jitter and total jitter, the power supply wiring is enhanced by adding the grid patterns or the like relative to the comparative pattern PTN18.

According to the analysis results, it is found that the jitter in the pattern PTN1 of the above embodiment is improved relative to that in the comparative pattern PTN18.

Since the jitter in the pattern PTN6 is more improved than that in the pattern PTN1, the return path of the current becomes shorter by supplying the power from the power supply of the first bypass capacitor C11 on the right to the second bypass capacitor C12 in one route than in two routes. For this reason, it can be assumed that the jitter is suppressed.

Here, as shown in FIG. 8, by basically strengthening the bonding of the L2 layer under the power supply wiring of the L1 layer as GND wiring, the inductance is reduced.

Since the jitter is prone to deteriorate, relative to that in the pattern PTN6, in the pattern PTN7 where the ball BL in the center is eliminated, the pattern PTN8 where the grid patterns are eliminated, and the pattern PTN9 where the projection patterns are eliminated, it is found that these grid and projection forms are effective.

Here, the left form and the right form of the power supply wiring pattern area 30 may be bilaterally symmetric or may be not.

FIG. 22 shows comparison of the S parameter characteristics at 3.5 GHz in the patterns PTN1, PTN6, PTN8, and PTN9.

FIG. 25 illustrates the S parameters in the entire bandwidth.

Since the results generally match the already described results of jitter comparison, it is found that they relate to the S parameter (transmission) characteristics of the power supply.

FIG. 23 illustrates comparison of the impedance characteristics at 1.95 GHz in the patterns PTN1, PTN6, PTN8, and PTN9.

FIG. 26 illustrates the impedance characteristics in the entire bandwidth.

In the cases, the impedance is obtained from a voltage equation when 1A flows at Z=V/I.

Since the results generally match the already described results of jitter comparison, it is found that they relate to the impedance characteristics of the power supply.

FIG. 24 shows comparison of the inductance characteristics at 1.95 GHz in the patterns PTN1, PTN6, PTN8, and PTN9.

FIG. 27 illustrates the inductance in the entire bandwidth.

Here, although the inductance values are obtained by calculating from the S parameters in a simplified manner and the accuracy may not be sufficient in the high frequency regions, the results generally match the already described results of jitter comparison, and thus it is found that they also relate to the inductance characteristics of the power supply.

According to the results in FIG. 33, the jitter deteriorates in the pattern PTN2 where the second bypass capacitor C12 is eliminated from the pattern PTN1 and in the patterns PTN3 and PTN10 where the patterns are kept only on the right. For this reason, it is found that the supply to the power supply balls on the left and the second bypass capacitor C12 are effective.

It is also found that the jitter becomes less in the forms with additional patterns at the bottom, such as in the patterns PTN12, PTN13, PTN14, PTN15, PTN16, and PTN17.

As described above, according to the present embodiments, in a high speed memory interface board (six-layer board or eight-layer board), such as a DDR, or an LSI package board, additional wiring of the power supply wiring immediately below the LSI 20 (L1 layer) is provided in a grid between the balls.

With that, by securing a more area for power supply in a smaller number of layers, the power supply to the balls BL is enhanced and the effect of the bypass capacitors is improved, and thus the power supply GND impedance in the board is reduced and the inductance characteristics are improved. Then, this reduces the jitter and the power supply GND noises in the high speed IF LSI 20, such as a DDR memory interface (L2 layer is a solid GND).

The present circuit board 10 has the pattern forms provided with the effective power supply characteristics and bypass capacitor characteristics for the minimally small pattern area only of the L1 layer of the multilayer board and is capable of securing a clearance of 75 μm.

With that, it becomes possible to satisfy the characteristics with one bypass capacitor.

As just described, the circuit board 10 according to the present first embodiment can reduce the power supply GND impedance in the motherboard.

The SSO jitter and the clock jitter in the high speed IF LSI 20, such as a DDR memory interface, can be thus reduced.

The power supply GND noises and the electromagnetic interference (EMI) may be reduced.

Motherboards and external bypass capacitors can be cut, and consequently the costs may be cut.

The number of board layers can be cut, for example, from an eight-layer board to a six-layer board, and consequently the costs may be cut.

The present application contains subject matter related to that disclosed in Japanese Priority Patent Application JP 2009-027936 filed in the Japan Patent Office on Feb. 9, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A circuit board comprising:
   a plurality of balls functioning as electrodes aligned in a grid;
   a power supply wiring pattern area connected to power supply terminals of an integrated circuit mounted thereon; and
   a feeding pattern area connected to a feeding point; wherein
   the plurality of balls at least includes a first power supply ball group and a second power supply ball group connected respectively to first and second power supply terminal arrays, aligned at a predetermined interval, of the integrated circuit;
   the power supply wiring pattern area includes
      a first power supply connection pattern connected to the first power supply ball group,
      a second power supply connection pattern connected to the second power supply ball group, and
      at least one connection pattern connecting a first part of the first power supply connection pattern and a second part of the second power supply connection pattern and not in contact with the balls,
      wherein the first power supply connection pattern and the second power supply connection pattern are formed in parallel and the at least one connection pattern connects a first longitudinally central portion of the first power supply connection pattern and a second longitudinally central portion of the second power supply connection pattern;
   a first end portion of the first power supply connection pattern comprises
      a first connection portion connected to one end of the feeding pattern area, and
      a second connection portion to be connected to one electrode of a first bypass capacitor;
   a second end portion of the second power supply connection pattern comprises a third connection portion to be connected to one electrode of a second bypass capacitor.

2. The circuit board according to claim 1, wherein:
   the first power supply connection pattern and the second power supply connection pattern are formed in parallel;
   the at least one connection pattern includes
      a first connection pattern connecting the first longitudinally central portion of the first power supply connection pattern and the second longitudinally central portion of the second power supply connection pattern,
      a first extended pattern formed to extend from the first end of the first power supply connection pattern towards the second power supply connection pattern in parallel with the first connection pattern, and
      a second extended pattern formed to extend from the second end of the second power supply connection pattern towards the first power supply connection pattern in parallel with the first connection pattern.

3. The circuit board according to claim 2, wherein:
   the plurality of balls are aligned in a ball alignment between the first connection pattern and the first extended pattern and between the first connection pattern and the second extended pattern; and
   projections not in contact with the balls are formed along the ball alignment in at least a part of a first area where the first connection pattern and the first extended pattern face with each other and a second area where the first connection pattern and the second extended pattern face with each other.

4. The circuit board according to claim 2, wherein:
   the plurality of balls are aligned in a ball alignment on a side of the first connection pattern opposite from the areas facing the first extended pattern and the second extended pattern; and
   projections not in contact with the balls are formed along the ball alignment on the opposite side of the first connection pattern.

5. The circuit board according to claim 2, wherein:
   the plurality of balls are aligned in a ball alignment between the first connection pattern and the first extended pattern and between the first connection pattern and the second extended pattern; and
   at least one of the areas where the first connection pattern and the first extended pattern face with each other and where the first connection pattern and the second extended pattern face with each other is connected by a plurality of grid patterns not in contact with the balls.

6. The circuit board according to claim 2, further comprising:
   a second connection pattern connecting another end portion of the first power supply connection pattern and another end portion of the second power supply connection pattern.

7. The circuit board according to claim 2, wherein:
   the first extended pattern and the second extended pattern are connected with each other.

8. The circuit board according to claim 4, wherein:
   the plurality of balls on the side of the first connection pattern opposite from the areas facing the first extended pattern and the second extended pattern include a power supply ball connected to the power supply terminals of the integrated circuit; and
   the first connection pattern is connected to the power supply ball.

9. The circuit board according to claim 6, wherein:
   a plurality of balls is aligned in a ball alignment between the second connection pattern and the first connection pattern; and
   projections not in contact with the balls are formed along the ball alignment in an area of the second connection pattern facing the first connection pattern.

10. The circuit board according to claim 6, wherein:
    the plurality of balls is aligned in a ball alignment between the second connection pattern and the first connection pattern; and
    at least one of the areas where the first connection pattern and the second connection pattern face with each other is connected by a plurality of grid patterns not in contact with the balls.

* * * * *